(12) United States Patent
Kawabe

(10) Patent No.: US 8,497,977 B2
(45) Date of Patent: Jul. 30, 2013

(54) OPTICAL INTEGRATOR, ILLUMINATION OPTICAL SYSTEM, EXPOSURE APPARATUS, AND DEVICE MANUFACTURING METHOD

(75) Inventor: Yoshio Kawabe, Kumagaya (JP)

(73) Assignee: Nikon Corporation, Tokyo (JP)

( * ) Notice: Subject to any disclaimer, the term of this patent is extended or adjusted under 35 U.S.C. 154(b) by 491 days.

(21) Appl. No.: 12/706,586

(22) Filed: Feb. 16, 2010

(65) Prior Publication Data

US 2010/0231880 A1    Sep. 16, 2010

Related U.S. Application Data

(60) Provisional application No. 61/202,560, filed on Mar. 12, 2009, provisional application No. 61/272,894, filed on Nov. 16, 2009.

(51) Int. Cl.
*G03B 27/54* (2006.01)
*G21K 5/04* (2006.01)

(52) U.S. Cl.
USPC .............................. 355/67; 378/34

(58) Field of Classification Search
USPC ................... 355/50, 53, 67; 378/34
See application file for complete search history.

(56) References Cited

U.S. PATENT DOCUMENTS

| | | | | |
|---|---|---|---|---|
| 5,594,526 A * | 1/1997 | Mori et al. | | 355/67 |
| 5,760,963 A * | 6/1998 | Mori | | 359/622 |
| 6,781,671 B2 | 8/2004 | Komatsuda | | |
| 7,446,856 B2 * | 11/2008 | Komatsuda | | 355/67 |
| 8,149,386 B2 * | 4/2012 | Kajiyama | | 355/66 |
| 2005/0270513 A1 | 12/2005 | Dierichs et al. | | |
| 2007/0273859 A1 * | 11/2007 | Komatsuda | | 355/67 |
| 2007/0296936 A1 | 12/2007 | Kato et al. | | |
| 2009/0213355 A1 * | 8/2009 | Kajiyama | | 355/71 |

FOREIGN PATENT DOCUMENTS

| | | |
|---|---|---|
| DE | 10 2006 031 654 A1 | 10/2007 |
| EP | 1 521 111 A1 | 4/2005 |
| JP | 08-031736 | 2/1996 |
| JP | 08-262367 | 10/1996 |
| JP | 2004-304135 | 10/2004 |
| WO | WO 2006/080285 A1 | 8/2006 |
| WO | WO 2008/149178 A1 | 12/2008 |

OTHER PUBLICATIONS

International Search Report, from the European Patent Office in related International Application No. PCT/JP2010/054165, mailed Jun. 9, 2010.

* cited by examiner

*Primary Examiner* — Thomas R Artman
(74) *Attorney, Agent, or Firm* — Finnegan, Henderson, Farabow, Garrett & Dunner, L.L.P.

(57) ABSTRACT

An optical integrator used in an illumination optical system for illuminating an illumination target surface on the basis of light from a light source has a first fly's eye optical system having a plurality of first optical elements arranged in parallel at a position optically conjugate with the illumination target surface in an optical path between the light source and the illumination target surface, and a second fly's eye optical system having a plurality of second optical elements arranged in parallel so as to correspond to the plurality of first optical elements in an optical path between the first fly's eye optical system and the illumination target surface. At least one first optical element out of the plurality of first optical elements, and another first optical element different from the at least one first optical element have their respective postures different from each other about an optical axis of the illumination optical system or about an axis parallel to the optical axis.

27 Claims, 16 Drawing Sheets

OPTICAL INTEGRATOR, ILLUMINATION OPTICAL SYSTEM, EXPOSURE APPARATUS, AND DEVICE MANUFACTURING METHOD

CROSS-REFERENCE TO RELATED APPLICATIONS

This application is a non-provisional application claiming the benefit of priority of the provisional applications Nos. 61/202,560 filed on Mar. 12, 2009 and 61/272,894 filed on Nov. 16, 2009, the entire contents of which are incorporated herein by reference.

BACKGROUND

1. Filed

An embodiment according to the present invention relates to an optical integrator, illumination optical system, exposure apparatus, and device manufacturing method. More particularly, an embodiment according to the present invention relates to an optical integrator used in an illumination optical system of an exposure apparatus used in manufacturing devices such as semiconductor devices, imaging devices, liquid crystal display devices, and thin film magnetic heads by lithography.

2. Explanation of Related Art

The conventional exposure apparatus used in manufacturing the semiconductor devices and others is configured to project and transfer a circuit pattern formed on a mask (reticle), onto a photosensitive substrate (e.g., a wafer) through a projection optical system. The photosensitive substrate is coated with a resist, and the resist is exposed to light by projection exposure through the projection optical system, thereby forming a resist pattern corresponding to the mask pattern. The resolving power of exposure apparatus is dependent on the wavelength of exposure light and the numerical aperture of the projection optical system. Therefore, in order to improve the resolving power of exposure apparatus, it is necessary to decrease the wavelength of exposure light and increase the numerical aperture of the projection optical system.

In general, it is difficult in terms of optical design to increase the numerical aperture of the projection optical system beyond a certain value, and it is thus necessary to decrease the wavelength of exposure light to a shorter wavelength. Therefore, the technique of EUVL (Extreme Ultra-Violet Lithography) is drawing attention as a next-generation photolithography method of semiconductor patterning (exposure apparatus). The EUVL exposure apparatus uses the EUV (Extreme UltraViolet) light (radiation) having the wavelength in the range of about 5 to 20 nm. When the EUV light is used as exposure light, there is no available optical material that can transmit the light. For this reason, the EUVL exposure apparatus has to use a reflection type optical integrator, a reflection type mask, and a reflection type (catopric type) projection optical system.

In the general exposure apparatus, as well as the EUVL exposure apparatus, it is desirable to form a uniform and rotationally symmetric light intensity distribution (which will also be referred to hereinafter as "pupil intensity distribution") on an illumination pupil of an illumination optical system. The applicant of the present application proposed the technology of forming an almost uniform and rotationally symmetric pupil intensity distribution on the illumination pupil, by devising a correspondence relation between a plurality of first optical elements in a first fly's eye optical system and a plurality of second optical elements in a second fly's eye optical system in the reflection type optical integrator (See U.S. Pat. Published Application No. 2007/0273859)

The optical integrator disclosed in U.S. Pat. Published Application No. 2007/0273859 is configured so that the plurality of first optical elements in the first fly's eye optical system and the plurality of second optical elements in the second fly's eye optical system are set in optical correspondence in a nearly random form.

SUMMARY

Illumination fields formed on an illumination target surface by a plurality of beams obtained by wavefront division by the plurality of first optical elements are formed as deviating from a desired superimposed illumination region because of influence of various aberrations of the illumination optical system and (image rotation due to) projection or the like, so as to cause a light quantity loss due to so-called superposition errors of the illumination fields.

An embodiment according to the present invention has been accomplished in view of the foregoing problem and it is an object of embodiments according to the present invention to provide an optical integrator capable of keeping the light quantity loss small.

A first aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein at least one first optical element out of the plurality of first optical elements, and another first optical element different from the at least one first optical element have respective postures different from each other about an optical axis of the illumination optical system or about an axis parallel to the optical axis.

A second aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein at least one first optical element out of the plurality of first optical elements, and another first optical element different from the at least one first optical element have respective lengths along a predetermined direction different from each other.

A third aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein at least one second optical element out of the plurality of second optical elements is arranged on a standard array surface of the plurality of second optical elements, and wherein another second optical element different from the at least one second optical element out of the plurality of second optical elements is arranged with a required level difference from the standard array surface.

A fourth aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein a size of the first fly's eye optical system and a distance between a center of an array surface of the plurality of first optical elements and a center of a standard array surface of the plurality of second optical elements are determined so that each illumination region formed on the illumination target surface by a beam traveling via each first optical element and corresponding second optical element becomes close to a desired superimposed illumination region.

A fifth aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target, surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein a size D of the first fly's eye optical system and a distance K between a center of an array surface of the plurality of first optical elements and a center of a standard array surface of the plurality of second optical elements satisfy the following condition:

$$0.17 < D/K < 1.64.$$

A sixth aspect of an embodiment according to the present invention provides an optical integrator used in an illumination optical system for illuminating an illumination target surface on the basis of light from a light source, the optical integrator comprising:

a first fly's eye optical system having a plurality of first optical elements arranged in parallel at a position optically conjugate with the illumination target surface in an optical path between the light source and the illumination target surface; and a second fly's eye optical system having a plurality of second optical elements arranged in parallel so as to correspond to the plurality of first optical elements in an optical path between the first fly's eye optical system and the illumination target surface, wherein at least either of postures and lengths of at least one first optical element out of the plurality of first optical elements and another first optical element different from the at least one first optical element, and at least either one of a distance between the at least one first optical element and the corresponding second optical element and a distance between the other first optical element and the corresponding second optical element are determined so as to reduce a superposition error between a first illumination region formed on the illumination target surface by a first beam traveling via the at least one first optical element and corresponding second optical element and a second illumination region formed on the illumination target surface by a second beam traveling via the other first optical element and corresponding second optical element.

A seventh aspect of an embodiment according to the present invention provides an illumination optical system for illuminating an illumination target surface on the basis of light from a light source, the illumination optical system comprising the optical integrator of the first aspect, the second aspect, the third aspect, the fourth aspect, the fifth aspect, or the sixth aspect.

An eighth aspect of an embodiment according to the present invention provides an exposure apparatus comprising the illumination optical system of the seventh aspect for illuminating a predetermined pattern, the exposure apparatus implementing exposure of the predetermined pattern on a photosensitive substrate.

A ninth aspect of an embodiment according to the present invention provides a device manufacturing method comprising:

implementing the exposure of the predetermined pattern on the photosensitive substrate, using the exposure apparatus of the eighth aspect;

developing the photosensitive substrate with the predetermined pattern transferred, and forming a mask layer in a shape corresponding to the predetermined pattern, on a surface of the photosensitive substrate; and processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION

Figure 1:
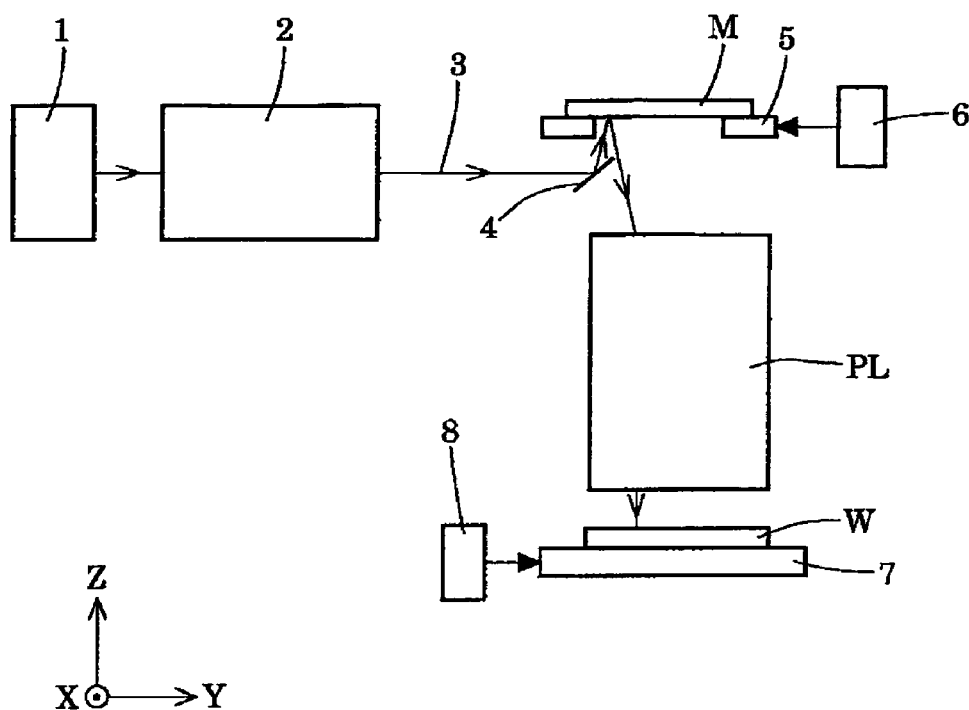
FIG. 1 is a drawing schematically showing an overall configuration of an exposure apparatus according to an embodiment of the present invention.
Figure 2:
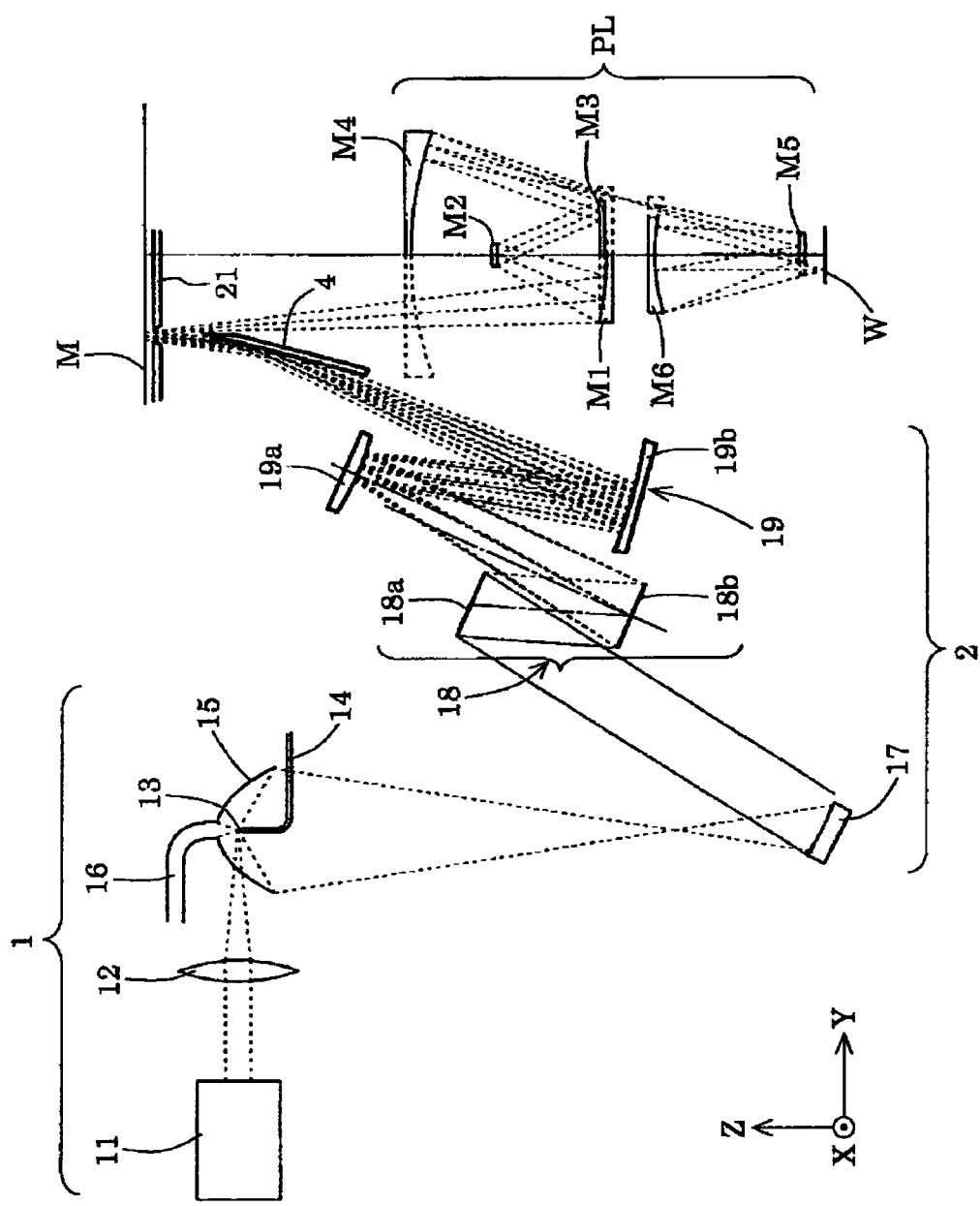
FIG. 2 is a drawing schematically showing internal configurations of a light source, an illumination optical system, and a projection optical system shown in FIG. 1.

Embodiments of the present invention will be described on the basis of the accompanying drawings. FIG. 1 is a drawing schematically showing an overall configuration of an exposure apparatus according to an embodiment of the present invention. FIG. 2 is a drawing schematically showing internal configurations of a light source (radiation source), an illumination optical system, and a projection optical system shown in FIG. 1. In FIG. 1, the Z-axis is set along a direction of a normal to a surface (exposure surface) of a wafer W being a photosensitive substrate, the Y-axis along a direction parallel to the plane of FIG. 1 in the surface of the wafer W, and the X-axis along a direction perpendicular to the plane of FIG. 1 in the surface of the wafer W.

Referring to FIG. 1, exposure (illumination) light (radiation) is supplied from a light source 1 in the exposure apparatus of the present embodiment. The light source 1 to be used herein can be, for example, a laser plasma light source. The light emitted from the light source 1 travels through a wavelength selecting filter (not shown) to enter an illumination optical system 2. The wavelength selecting filter has a property to selectively transmit only EUV light of a predetermined wavelength (e.g., 13.4 nm), out of the light supplied from the light source 1, and to block transmission of light at the other wavelengths. The EUV light 3 transmitted by the wavelength selecting filter travels via the illumination optical system 2 and a plane reflecting mirror 4 as a path deflecting mirror to illuminate a reflection type mask (reticle) M on which a pattern to be transferred is formed.

The mask M is held by a mask stage 5 movable along the Y-direction, in such a state that its pattern surface extends along the XY plane. Movement of the mask stage 5 is measured by a laser interferometer 6 having a well-known configuration. Light from the pattern on the mask M thus illuminated travels via a reflection type projection optical system PL to form an image of the mask pattern on the wafer W being a photosensitive substrate. Namely, for example, a static exposure region (effective exposure region) of an arcuate shape symmetric with respect to the Y-axis is formed on the wafer W, as described below.

The wafer W is held by a wafer stage 7 two-dimensionally movable along the X-direction and the Y-direction, in such a state that its exposure surface extends along the XY plane. Movement of the wafer stage 7 is measured by a laser interferometer 8 having a well-known configuration. As so configured, the pattern on the mask M is transferred onto a rectangular shot area on the wafer W by performing scanning exposure (scan photolithography) with movement of the mask stage 5 and the wafer stage 7 along the Y-direction, i.e., with movement of the mask M and the wafer W relative to the projection optical system PL along the Y-direction.

At this time, when the projection (transfer) magnification (lateral magnification) of the projection optical system PL is, for example, ¼, synchronous scanning is carried out while a moving speed of the wafer stage 7 is set to be quarter of a moving speed of the mask stage 5. By repeating the scanning exposure with two-dimensional step movement of the wafer stage 7 along the X-direction and the Y-direction, the pattern on the mask M is sequentially transferred onto each of shot areas on the wafer W.

Referring to FIG. 2, the laser plasma light source 1 has a laser light source 11, a condensing lens 12, a nozzle 14, an ellipsoidal reflecting mirror 15, and a duct 16. In the light source 1, for example, a high-pressure gas consisting of xenon (Xe) is supplied from the nozzle 14 and the gas jetted out from the nozzle 14 forms a gas target 13. Light (non-EUV light) emitted from the laser light source 11 travels through the condensing lens 12 to be focused on the gas target 13. The gas target 13 acquires energy from the focused laser beam to create plasma, from which EUV light is emitted.

The gas target 13 is positioned at the first focus of the ellipsoidal reflecting mirror 15. Therefore, the EUV light emitted from the laser plasma light source 1 is focused at the second focus of the ellipsoidal reflecting mirror 15. On the other hand, the gas after the emission of light is suctioned through the duct 16 to be guided to the outside. The EUV light focused at the second focus of the ellipsoidal reflecting mirror 15 travels via a concave reflecting mirror 17 to become a flux of nearly parallel light to be guided to an optical integrator 18 consisting of a pair of fly's eye optical systems 18a and 18b. Configurations and actions of the first fly's eye optical system 18a and the second fly's eye optical system 18b will be described later.

In this manner, a substantial surface illuminant (pupil intensity distribution) having a predetermined shape is formed at a position near an exit surface of the optical integrator 18, i.e., near a reflecting surface of the second fly's eye optical system 18b (or at a position of an illumination pupil). Light from the substantial surface illuminant travels via a condenser optical system 19 composed of a convex reflecting mirror 19a and a concave reflecting mirror 19b, to emerge from the illumination optical system 2. The illumination pupil of the illumination optical system 2 is an entrance pupil of the projection optical system PL, or a position optically conjugate with the entrance pupil of the projection optical system PL.

The light emerging from the illumination optical system 2 is deflected by the plane reflecting mirror 4 and then travels through an arcuate aperture (light transmitting portion) of a field stop 21 arranged substantially in parallel and in proximity to the mask M, to form an arcuate illumination region on the mask M. As described above, the light source 1 (11-16), the illumination optical system 2 (17-19), the plane reflecting mirror 4, and the field stop 21 constitute an illumination system that illuminates the pattern on the mask M by Köhler illumination with the light from the pupil intensity distribution formed on the illumination pupil.

Light from the pattern on the mask M thus illuminated travels via the projection optical system PL to form an image of the mask pattern in an arcuate static exposure region on the wafer W. The projection optical system PL is composed of a first reflecting imaging optical system for forming an intermediate image of the pattern on the mask M, and a second reflecting imaging optical system for forming an image of the intermediate image of the mask pattern (secondary image of the pattern on the mask M) on the wafer W. The first reflecting imaging optical system is composed of four reflecting mirrors M1-M4 and the second reflecting imaging optical system is composed of two reflecting mirrors M5 and M6. The projection optical system PL is an optical system telecentric on the wafer side (image side).

Figure 3:
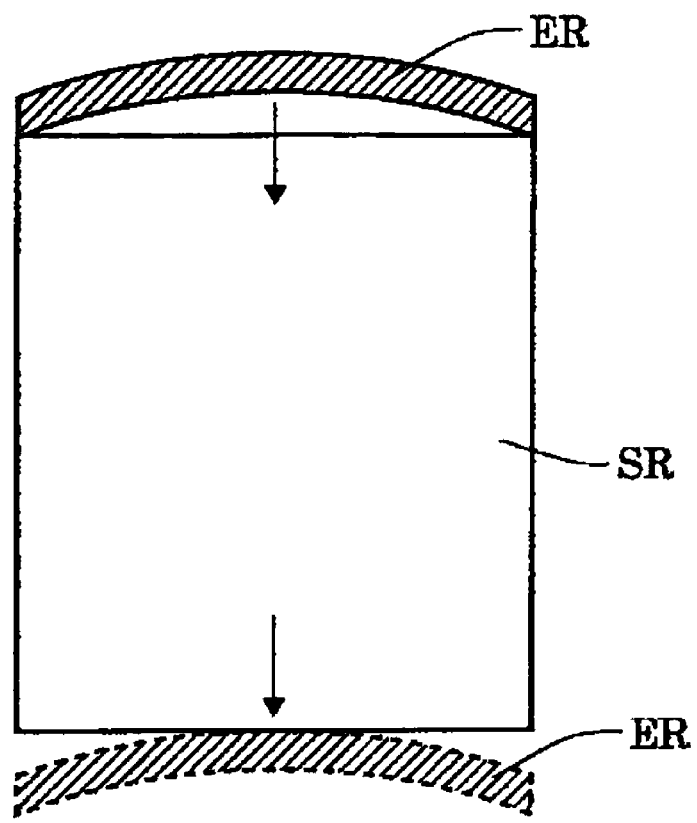
FIG. 3 is a drawing for schematically illustrating one scanning exposure in the embodiment.

FIG. 3 is a drawing schematically illustrating one scanning exposure in the present embodiment. Referring to FIG. 3, in the exposure apparatus of the present embodiment, a static exposure region ER of an arcuate shape symmetric with respect to the Y-axis is formed on the surface of the wafer W and an illumination region of the same arcuate shape symmetric with respect to the Y-axis is formed on the pattern surface of the mask M so as to correspond to the effective image region and effective field of the arcuate shape of the projection optical system PL. This arcuate exposure region ER moves from a scan start position indicated by solid lines in the drawing, to a scan end position indicated by dashed lines in the drawing, during transferring the pattern of the mask M onto one rectangular shot area SR on the wafer W by one scanning exposure (scan photolithography).

Figure 4:
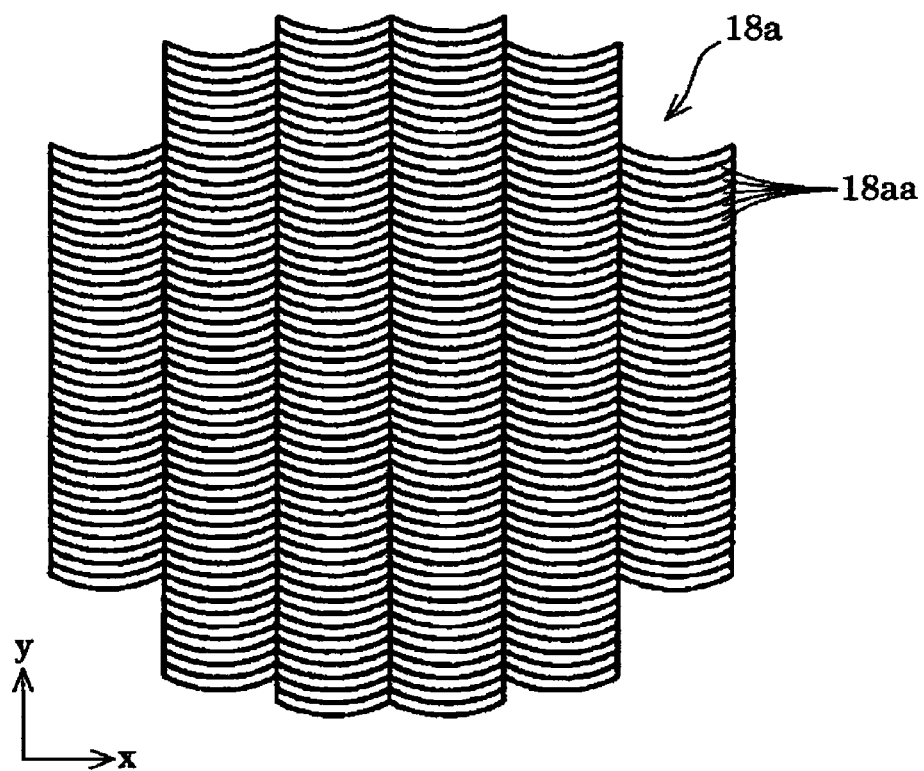
FIG. 4 is a drawing schematically showing a configuration of a first fly's eye optical system in an optical integrator in the embodiment.
Figure 5:
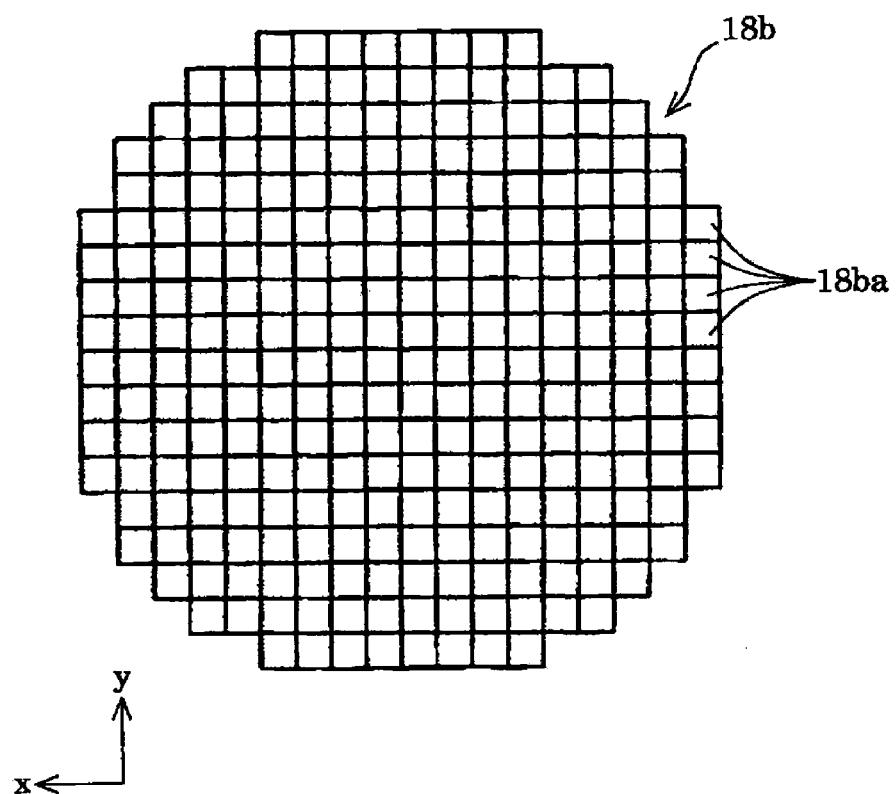
FIG. 5 is a drawing schematically showing a configuration of a second fly's eye optical system in the optical integrator in the embodiment.

FIGS. 4 and 5 are drawings schematically showing the configuration of the optical integrator in the present embodiment. In the optical integrator 18, the first fly's eye optical system 18a is provided with a plurality of first concave reflector elements (first optical elements) 18aa, as shown in FIG. 4. The plurality of first concave reflector elements 18aa are arranged in parallel at a position optically conjugate with the pattern surface of the mask M which is an illumination target surface of the illumination optical system 2. The second fly's eye optical system 18b is provided with a plurality of second concave reflector elements (second optical elements) 18ba, as shown in FIG. 5. The plurality of second concave reflector elements 18ba are arranged in parallel so as to be optically in one-to-one correspondence in a nearly random form to the plurality of first concave reflector elements 18aa.

In FIG. 4, the x-direction is set along a direction corresponding to the X-direction in an entrance surface of the first fly's eye optical system 18a and the y-direction along a direction perpendicular to the x-direction in the entrance surface of the first fly's eye optical system 18a. Similarly, in FIG. 5, the x-direction is set along a direction corresponding to the X-direction in an entrance surface of the second fly's eye optical system 18b and the y-direction along a direction perpendicular to the x-direction in the entrance surface of the second fly's eye optical system 18b. Namely, the y-directions in FIGS. 4 and 5 correspond to the scanning direction (Y-direction) of the mask M and the wafer W. It is also noted that FIGS. 4 and 5 are depicted with the numbers of concave reflector elements 18aa, 18ba constituting the pair of fly's eye optical systems 18a, 18b smaller than the actual numbers thereof, for clarity of the drawings.

The first fly's eye optical system 18a, as shown in FIG. 4, is constructed by vertically and horizontally arranging the first concave reflector elements 18aa having an arcuate contour. The first concave reflector elements 18aa have the arcuate contour in order to form the arcuate illumination region on the mask M and eventually form the arcuate static exposure region ER on the wafer W, corresponding to the effective image region and effective field of the arcuate shape of the projection optical system PL, as described above.

On the other hand, the second fly's eye optical system 18b, as shown in FIG. 5, is constructed by vertically and horizontally arranging the second concave reflector elements 18ba having a rectangular contour, for example, close to a square shape. The second concave reflector elements 18ba have the rectangular contour close to a square because a small illuminant of a nearly circular shape is formed at or near a surface of each second concave reflector element 18ba.

A contour of the entrance surface of the first fly's eye optical system 18a is close to a circular shape because a sectional shape of a beam entering the optical integrator 18 (i.e., a beam entering the first fly's eye optical system 18a) is approximately circular, and it enhances illumination efficiency. A contour of the entrance surface of the second fly's eye optical system 18b is close to a circular shape because a contour of the pupil intensity distribution (substantial surface illuminant) formed on the illumination pupil near the exit surface of the optical integrator 18 (i.e., near the exit surface of the second fly's eye optical system 18b) is approximately circular.

In the present embodiment, the beam entering the optical integrator 18 is subjected to wavefront division by the plurality of first concave reflector elements 18aa in the first fly's eye optical system 18a. Beams reflected by the respective first concave reflector elements 18aa are incident to the corresponding second concave reflector elements 18ba in the second fly's eye optical system 18b. The beams reflected by the respective second concave reflector elements 18ba travel via the condenser optical system 19 as a waveguide optical system to illuminate an arcuate illumination region on the mask M in a superimposed manner.

Figure 6:
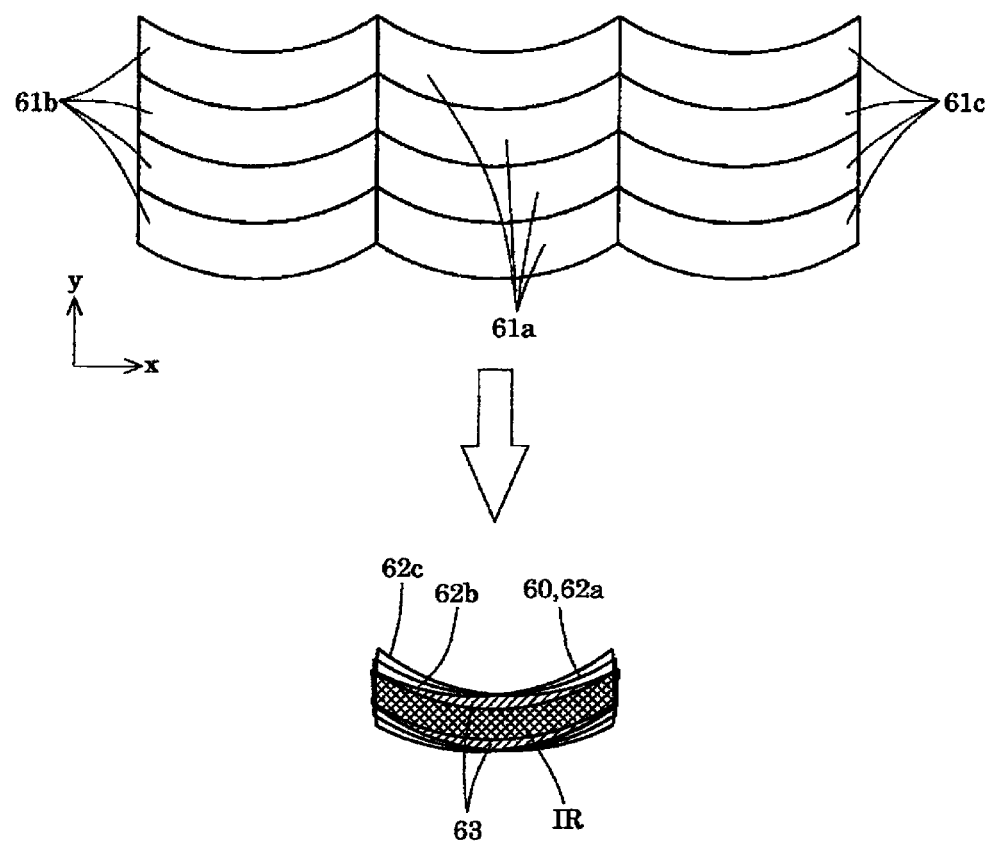
FIG. 6 is a drawing to illustrate a state in which superposition errors of illumination fields are caused by influence of (image rotation or rotational strain due to) projection of an illumination optical system when a plurality of first concave reflector elements in the first fly's eye optical system are arrayed according to the conventional technology.

The disadvantage of the conventional technology and each of techniques of an embodiment will be described below on the basis of an optical integrator having a configuration simpler than the configuration shown in FIGS. 4 and 5. FIG. 6 is a drawing to illustrate a state in which superposition errors of illumination fields are caused by influence of image rotation or rotational strain due to projection of the illumination optical system in a case where a plurality of first concave reflector elements in the first fly's eye optical system are arrayed in accordance with the conventional technology. In the conventional technology, as shown in the upper part of FIG. 6, a group of first concave reflector elements 61a having an arcuate contour are arrayed in the y-direction (direction corresponding to the Y-direction being the scanning direction of the mask M and the wafer W) in a standard posture so that their arcuate sides are adjacent to each other.

In proximity on the left side in the drawing to the group of first concave reflector elements 61a, a group of first concave reflector elements 61b having an arcuate contour are arrayed in the y-direction in the standard posture so that their arcuate sides are adjacent to each other. Furthermore, in proximity on the right side in the drawing to the group of first concave reflector elements 61a, a group of first concave reflector elements 61c having an arcuate contour are arrayed in the y-direction in the standard posture so that their arcuate sides are adjacent to each other.

FIG. 6 shows the optical integrator in a three-group configuration in which each group includes four first concave reflector elements, as a simplified model. The standard posture herein refers to a posture in which the contour of the first concave reflector element is optically conjugate with a desired arcuate superimposed illumination region to be formed in a superimposed manner on the illumination target surface (the pattern surface of the mask M and, in turn, the exposure surface of the wafer W) by beams obtained by wavefront division by the plurality of first concave reflector elements 61a-61c, i.e., a posture in which the arcuate contour of the first concave reflector elements 61a-61c becomes symmetric with respect to the y-axis.

In other words, as long as the rear optical system consisting of the optical integrator (including the plurality of first concave reflector elements 61a-61c) and the condenser optical system is in an aberration-free ideal state, the beams obtained by wavefront division by the plurality of first concave reflector elements 61a-61c arrayed in the standard posture in accordance with the conventional technology in the first fly's eye optical system form the desired arcuate superimposed illumination region while being almost perfectly superimposed on the illumination target surface. In practice, however, superposition errors of illumination fields are caused by various aberrations of the rear optical system, particularly, by influence of image rotation or rotational strain due to projection, as schematically shown in the lower part of FIG. 6.

Referring to FIG. 6, each of beams traveling via the first group of first concave reflector elements 61a located in the center along the x-direction (direction corresponding to the X-direction perpendicular to the scanning direction of the mask M and the wafer W) out of the plurality of first concave reflector elements 61a-61c, is less affected than the beams traveling via the first concave reflector elements 61b, 61c, by the image rotation or rotational strain due to projection of the rear optical system, and forms an arcuate illumination field 62a in a substantially identical orientation (or in a substantially identical posture) with the desired arcuate superimposed illumination region 60 on the illumination target surface. In contrast to it, beams traveling via the second group of first concave reflector elements 61b and the third group of first concave reflector elements 61c located off the center along the x-direction, are affected by the image rotation or rotational strain due to projection of the rear optical system and tend to form arcuate illumination fields 62b and 62c in orientations different from that of the desired superimposed illumination region 60.

According to a typical example, the arcuate illumination field 62b formed by each of beams traveling via the second group of first concave reflector elements 61b tends to be formed in such an orientation that the desired superimposed illumination region 60 is rotated counterclockwise (or clockwise) in FIG. 6. On the other hand, the arcuate illumination field 62c formed by each of beams traveling via the third group of first concave reflector elements 61c tends to be formed in such an orientation that the desired superimposed illumination region 60 is rotated clockwise (or counterclockwise) in FIG. 6. An angle of inclination of the arcuate illumination field 62b and an angle of inclination of the arcuate illumination field 62c relative to the desired superimposed illumination region 60 tend to be almost equal to each other. It is assumed hereinafter that the arcuate illumination field 62b and the arcuate illumination field 62c are inclined in directions opposite to each other and their inclination angles are equal to each other.

In this case, an overlapping illumination field 63 formed in common on the illumination target surface by the plurality of beams obtained by wavefront division by the plurality of first concave reflector elements 61a-61c has a distorted contour and an arcuate illumination region IR corresponding to the arcuate static exposure region ER has to be set in a relatively small area in the overlapping illumination field 63. This means that the field stop arranged in proximity to the mask M blocks light traveling toward the outside of the arcuate illumination region IR, out of the light wavefront-divided by the plurality of first concave reflector elements 61a-61c and traveling toward the mask M, and the blocked light does not contribute to illumination of the pattern on the mask M (and to scanning exposure on the wafer W eventually); that is, there occurs a light quantity loss due to the superposition errors of the illumination fields 62a-62c.

Since the reflectance of each of multilayer reflecting films used in the optical systems is relatively small, about 0.7, in the EUVL exposure apparatus, it is important to avoid reduction in throughput of scanning exposure by minimizing the light quantity loss caused by the superposition errors of illumination fields. An example of the first technique of an embodiment is to change the posture of the second group of first concave reflector elements 61b so that the orientation of the arcuate illumination field (illumination region) 62b formed on the illumination target surface by the beams traveling via the second group of first concave reflector elements 61b and the corresponding second concave reflector elements becomes closer to the orientation of the desired superimposed illumination region 60.

Similarly, the posture of the third group of first concave reflector elements 61c is also changed so that the orientation of the arcuate illumination field 62c formed on the illumination target surface by the beams traveling via the third group of first concave reflector elements 61c and the corresponding second concave reflector elements becomes closer to the orientation of the desired superimposed illumination region 60. Specifically, as shown in the upper part of FIG. 7, the first concave reflector elements 61a of the first group are arranged in the standard posture, the first concave reflector elements 61b of the second group are arranged in a first tilt posture, and the first concave reflector elements 61c of the third group are arranged in a second tilt posture.

The first tilt posture is a posture obtained by rotating the standard posture by a required angle in a required direction, for example, about a required axis (the optical axis or an axis parallel to the optical axis) perpendicular to the array surface (xy plane) of the plurality of first concave reflector elements 61a-61c. On the other hand, the second tilt posture is a posture obtained by rotating the standard posture in a direction opposite to that of the first tilt posture and by the same angle as the angle of the first tilt posture, about the required axis perpendicular to the array surface. Namely, the first tilt posture and the second tilt posture are symmetric with respect to a straight line extending along the y-direction.

Figure 7:
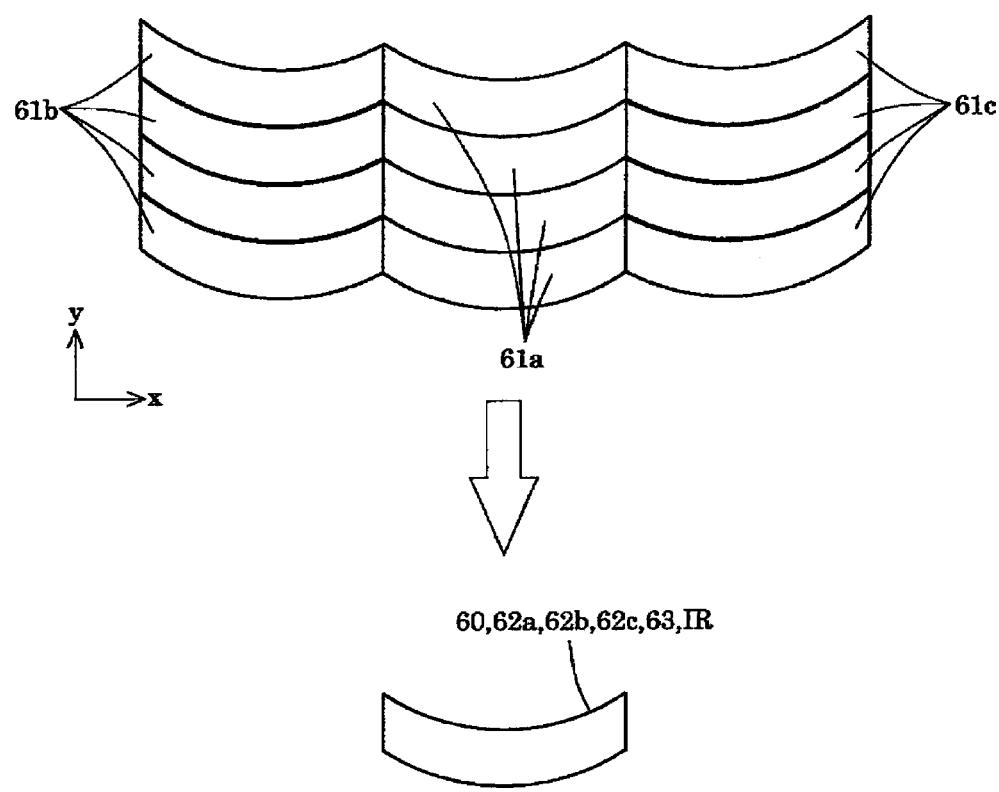
FIG. 7 is a drawing to illustrate a first technique of an embodiment.

In this case, as schematically shown in the lower part of FIG. 7, each of beams traveling via the second group of first concave reflector elements 61b set in the first tilt posture and each of beams traveling via the third group of first concave reflector elements 61*c* set in the second tilt posture form arcuate illumination fields 62*a*-62*c* in an almost identical orientation (or in an almost identical posture) with the desired arcuate superimposed illumination region 60 on the illumination target surface as well as each of the beams traveling via the first group of first concave reflector elements 61*a* set in the standard posture does. As a result, a relatively large arcuate illumination region IR can be secured in the arcuate overlapping illumination field 63 formed in common on the illumination target surface by the plurality of beams obtained by wavefront division by the plurality of first concave reflector elements 61*a*-61*c*. Namely, the superposition errors of the illumination fields 62*a*-62*c* are kept small and in turn the light quantity loss caused by the superposition errors of the illumination fields 62*a*-62*c* is also kept small.

In general, the first technique of an embodiment is to set at least one first optical element and another first optical element out of a plurality of first optical elements (corresponding to the first concave reflector elements 61*a*-61*c*) in the first fly's eye optical system, in mutually different postures about the optical axis of the illumination optical system or about an axis parallel to the optical axis. In other words, at least two first optical elements are set in mutually different postures about a predetermined axis. For example, the foregoing postures of the at least two first optical elements are determined so that orientations of illumination regions formed on the illumination target surface by beams traveling via the first optical elements and corresponding second optical elements become close to the orientation of the desired superimposed illumination region. For example, in a case where a first direction and a second direction perpendicular thereto are set for an illumination region, an orientation of the illumination region can be defined as a direction in which the length of the illumination region is larger. Where a first direction and a second direction perpendicular thereto are set for the desired superimposed illumination region, an orientation of the desired superimposed illumination region can be defined as a direction in which the length of the desired superimposed illumination region is larger. In other words, the postures of the at least two first optical elements are determined so as to make smaller the superposition error between the illumination regions formed on the illumination target surface by the beams traveling via the first optical elements and corresponding second optical elements.

In the case where the first fly's eye optical system is composed of the plurality of arcuate first concave reflector elements 61*a*-61*c*, as shown in the example of FIG. 7, a required average posture along the array surface thereof can be determined for each group of the plurality of first concave reflector elements arrayed in the y-direction. In this case, even when the second group of first concave reflector elements 61*b* and the third group of first concave reflector elements 61*c* are arranged in the tilt postures, there occurs no clearance between a pair of adjacent optical elements and the optical quantity loss in the first fly's eye optical system can be avoided eventually.

It is also possible to individually set a required number of first concave reflector elements, out of the plurality of arcuate first concave reflector elements 61*a*-61*c* constituting the first fly's eye optical system, in required tilt postures (without always having to be limited to the postures along the array surface), different from the example of FIG. 7. In this case, however, there occurs a clearance between a pair of adjacent optical elements and this results in causing a light quantity loss in the first fly's eye optical system.

When the first technique of an embodiment is applied to the present embodiment, an example of application can be to determine a required average posture along the array surface, for each group consisting of a plurality of first concave reflector elements 18*aa* arrayed in the y-direction. Specifically, in the six-group configuration shown in FIG. 4, the two groups in the center are set in respective required tilt postures obtained by rotating the standard posture in opposite directions by an identical angle. The two groups adjacent to the two center groups along the x-direction are set in respective required tilt postures obtained by rotating the standard posture in opposite directions by an identical angle larger than the tilt angle of the two center groups.

Furthermore, the two groups located at the outermost positions along the x-direction are set in respective required tilt postures obtained by rotating the standard posture in opposite directions by an identical angle larger than the tilt angle of the adjacent groups. This is because the influence of image rotation or rotational strain due to projection becomes greater with distance from the center in the x-direction. The example schematically shown in FIG. 4 is the configuration in which the first fly's eye optical system is composed of the even number of groups, but in configurations where it is composed of an odd number of groups, a group located in the center in the x-direction can be set in the standard posture.

When the first technique of an embodiment is applied to the optical integrator 18 of the present embodiment, it is feasible to make small the superposition errors of the illumination fields formed on the pattern surface of the mask M by the plurality of beams obtained by wavefront division by the plurality of first concave reflector elements 18*aa* and, in turn, to make small the light quantity loss caused by the superposition errors of the illumination fields. As a consequence, the illumination optical system 2 of the present embodiment is able to illuminate the mask M under a required illumination condition with high luminous efficiency while keeping small the light quantity loss caused by the superposition errors of the illumination fields. Furthermore, the exposure apparatus of the present embodiment is able to perform excellent exposure under a good illumination condition, using the illumination optical system 2 which illuminates the pattern of the mask M under the required illumination condition with high luminous efficiency while suppressing the light quantity loss.

Figure 8:
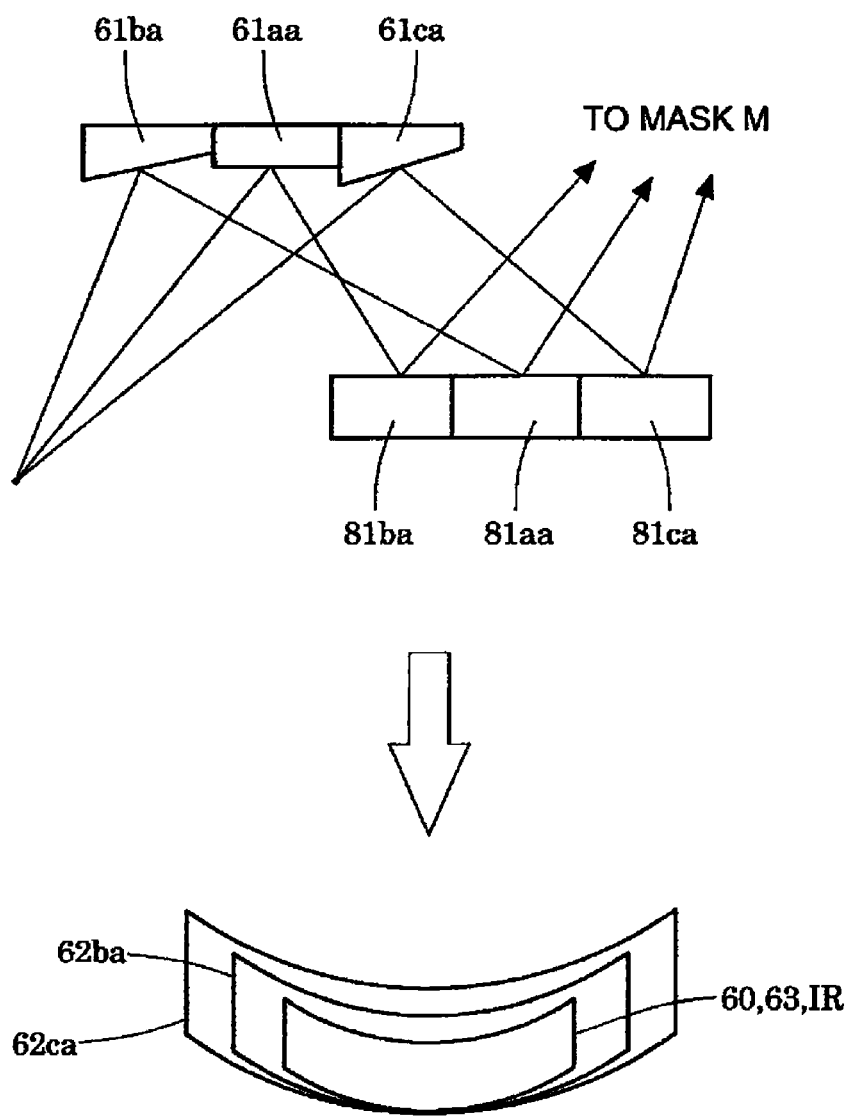
FIG. 8 is a drawing to illustrate a state in which superposition errors of illumination fields are caused by magnification differences among optical elements in the optical integrator.

FIG. 8 is a drawing to illustrate a state in which superposition errors of illumination fields are caused by magnification differences among the optical elements in the optical integrator. In the conventional technology disclosed in Patent Document 1, the plurality of first concave reflector elements in the first fly's eye optical system and the plurality of second concave reflector elements in the second fly's eye optical system are set in optical correspondence in a nearly random form. In an embodiment, this setting of optical correspondence in the nearly random form between the plurality of first concave reflector elements in the first fly's eye optical system and the plurality of second concave reflector elements in the second fly's eye optical system will be called a random method. In the configuration of the random method, as schematically shown in the upper part of FIG. 8, for example, one first concave reflector element 61*ba* among the second group of first concave reflector elements 61*b* in the first fly's eye optical system corresponds to a second concave reflector element 81 as in the second fly's eye optical system.

One first concave reflector element 61 as among the first group of first concave reflector elements 61*a* corresponds to a second concave reflector element 81*ba* in the second fly's eye optical system. Furthermore, one first concave reflector element 61*ca* among the third group of first concave reflector elements 61*c* corresponds to a second concave reflector element 81*ca* in the second fly's eye optical system. In general, in the configuration of the random method, the plurality of first concave reflector elements (first optical elements) in the first fly's eye optical system and the plurality of second concave reflector elements (second optical elements) in the second fly's eye optical system are in one-to-one correspondence according to such a relation that at least a pair of projected line segments intersect when a plurality of line segments connecting corresponding paired optical elements are projected onto a certain plane.

In this case, a magnification of an illumination field formed on the illumination target surface by a beam traveling via one first concave reflector element in the first fly's eye optical system and a corresponding second concave reflector element (length in a predetermined direction of the illumination field/length in a predetermined direction of a reflecting surface of the first concave reflector element), β, is represented by Eq (a) below, using a focal length fe of an element optical system consisting of the first concave reflector element and the corresponding second concave reflector element, and a focal length fc of the condenser optical system.

$$\beta = fc/fe \tag{a}$$

Furthermore, the magnification β of the illumination field is also represented by Eq (b) below, using an optical path length L1 between the corresponding pair of optical elements, and an optical path length L2 from the second concave reflector element to the condenser optical system.

$$\beta = L2/L1 \tag{b}$$

In a case where the second fly's eye optical system is configured to also function as the condenser optical system, by arraying the plurality of second concave reflector elements (second optical elements) along a predetermined curved surface, the optical path length L2 in Eq (b) above is replaced by an optical path length from the second concave reflector element to the illumination target surface.

In the conventional technology wherein the first fly's eye optical system is composed of the plurality of arcuate first concave reflector elements having the same size (standard size) as shown in the upper part of FIG. 6, even when there is no influence of aberration and others at all, magnifications (sizes) of the illumination fields 62a-62c formed on the illumination target surface by the beams traveling via the plurality of first concave reflector elements 61a-61c are different among the optical elements and there occur so-called superposition errors of the illumination fields due to the magnification differences among the optical elements. The superposition errors of this kind are prominent, particularly, in the configuration of the random method, but they also occur in a regular configuration wherein the optical elements are set in such one-to-one correspondence as to avoid intersection of the aforementioned pair of projected line segments.

For easier understanding of the description, it is assumed hereinafter that, as schematically shown in the lower part of FIG. 8, an arcuate illumination field 62ba formed by a beam traveling via the first concave reflector element 61ba and second concave reflector element 81aa is formed in a size larger than the desired arcuate superimposed illumination region 60. Furthermore, an arcuate illumination field 62ca formed by a beam traveling via the first concave reflector element 61ca and second concave reflector element 81ca is assumed to be formed in a size larger than the arcuate illumination field 62ba. It is further assumed that arcuate illumination fields formed by beams traveling via the other first concave reflector elements including the first concave reflector element 61aa are formed in a size approximately identical with the shape of the desired arcuate superimposed illumination region 60.

In this simple case, the overlapping illumination field 63 formed in common on the illumination target surface by the plurality of beams obtained by wavefront division by the plurality of first concave reflector elements 61a-61c is approximately coincident with the desired superimposed illumination region 60 and approximately coincident with the arcuate illumination region IR eventually. Of the light subjected to the wavefront division by the first concave reflector elements 61ba and 61ca and traveling toward the mask M, the light traveling toward the outside of the arcuate illumination region IR does not contribute to illumination of the pattern on the mask M (and eventually to the scanning exposure on the wafer W) and a light quantity loss is caused by the superposition errors of the illumination fields due to the magnification differences among the optical elements.

In practice, it is generally the case that the illumination fields formed via some first concave reflector elements become smaller than the desired superimposed illumination region 60, the illumination fields formed via some first concave reflector elements become approximately identical in size with the desired superimposed illumination region 60, and the illumination fields formed via some first concave reflector elements become larger than the desired superimposed illumination region 60. Therefore, the light quantity loss caused by the superposition errors of illumination fields due to the magnification differences among the optical elements is unignorable, particularly, in the configuration of the random method.

The second technique of an embodiment is to set at least one first optical element and another first optical element out of the plurality of first optical elements (corresponding to the first concave reflector elements 61a-61c) in the first fly's eye optical system so that their lengths along a predetermined direction are different from each other. In other words, at least two first optical elements are set so that their lengths in the predetermined direction are different from each other. The predetermined direction can be selected, for example, to be the y-direction in the upper part of FIG. 6, i.e., the direction in which the plurality of first concave reflector elements 61a-61c are arrayed so that their arcuate sides are adjacent to each other. The y-direction in the upper part of FIG. 6 corresponds to the Y-direction being the scanning direction of the mask M and the wafer W, as described above.

The lengths in the predetermined direction of the foregoing at least two first optical elements are determined so that lengths in the predetermined direction of illumination fields formed on the illumination target surface by beams traveling via the first optical elements and corresponding second optical element become close to the length in the predetermined direction of the desired superimposed illumination region. In other words, the lengths along the predetermined direction of the at least one first optical element and other first optical element are determined so as to make small the superposition errors of the illumination regions formed on the illumination target surface by the beams traveling via the first optical elements and the corresponding second optical elements. When the second technique of an embodiment is applied to the simple example shown in FIG. 8, the length along the y-direction of one first concave reflector element 61ba among the second group of first concave reflector elements 61b and the length along the y-direction of one first concave reflector element 61ca among the third group of first concave reflector elements 61c in the first fly's eye optical system are adjusted as shown in the upper part of FIG. 9.

Figure 9:
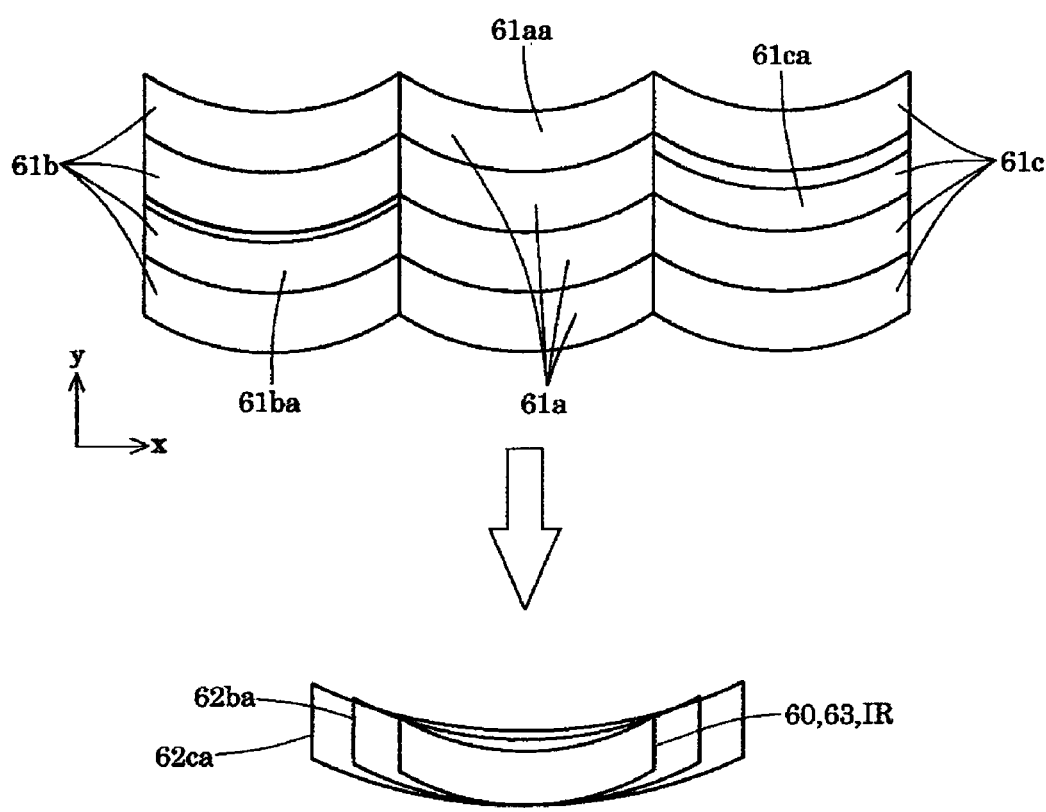
FIG. 9 is a drawing to illustrate a second technique of an embodiment.

In the upper part of FIG. 9, the y-directional length of the first concave reflector element 61*ba* is adjusted so as to be smaller than the standard length in the y-direction of the first concave reflector elements and the y-directional length of the first concave reflector element 61*ca* is adjusted so as to be smaller than the length in the y-direction of the first concave reflector element 61*ba*. In this manner, as schematically shown in the lower part of FIG. 9, lengths in the Y-direction (vertical direction in the lower part of FIG. 9; scanning direction) of the arcuate illumination fields 62*ba* and 62*ca* formed by beams traveling via the first concave reflector elements 61*ba* and 61*ca* become closer to the length in the Y-direction of the desired superimposed illumination region 60, so as to keep small the superposition errors of the illumination fields due to the magnification differences among the optical elements.

In the case where only the y-directional lengths of the first concave reflector elements are adjusted, two-dimensional array adjustment of the plurality of first concave reflector elements is simple and easy. In the example shown in FIG. 9, because the y-directional lengths of the first concave reflector elements 61*ba* and 61*ca* are set to be smaller than the standard length, small arcuate clearances are made along the arcuate sides of the optical elements adjusted in length when the overall contour of the first fly's eye optical system is maintained. In this case, if necessary, the small arcuate clearances may be filled with additional arcuate first concave reflector elements.

On the other hand, in cases where the x-directional lengths of the first concave reflector elements are adjusted or where the x-directional lengths and the y-directional lengths of the first concave reflector elements both are adjusted, the two-dimensional array adjustment of the plurality of first concave reflector elements becomes complicated. When the second technique of an embodiment is applied to the optical integrator 18 of the present embodiment, we can enjoy the same effect as in the case of application of the first technique.

The third technique of an embodiment is to arrange at least one second optical element out of the plurality of second optical elements in the second fly's eye optical system (second concave reflector elements 18*ba* in FIG. 5; the second concave reflector elements 81*aa*, 81*ba*, 81*ca*, etc. in the upper part of FIG. 8) on a standard array surface and arrange another second optical element on a surface with a required level difference from the standard array surface. The standard array surface herein refers to a plane on which the plurality of second optical elements are to be arrayed, for example, according to the technique of the conventional technology.

Figure 10:
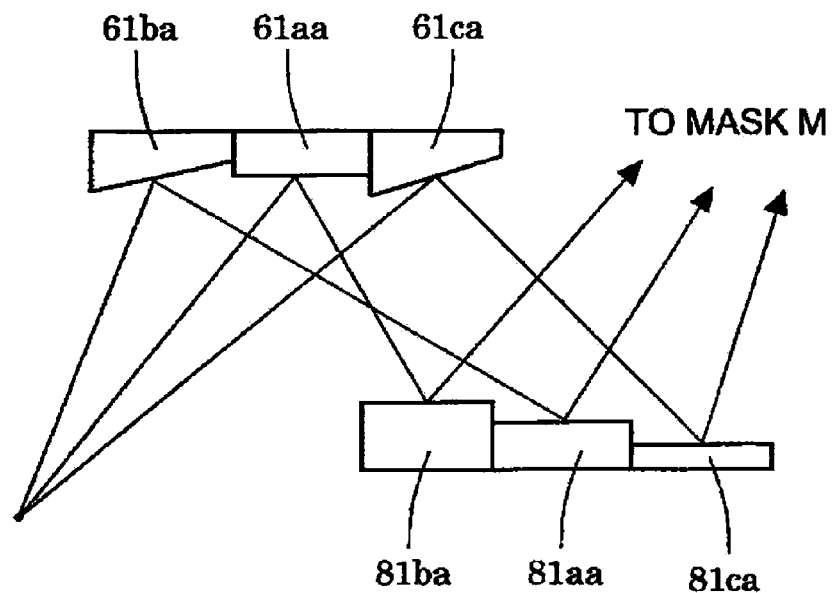
FIG. 10 is a drawing to illustrate a third technique of an embodiment.
Figure 10:
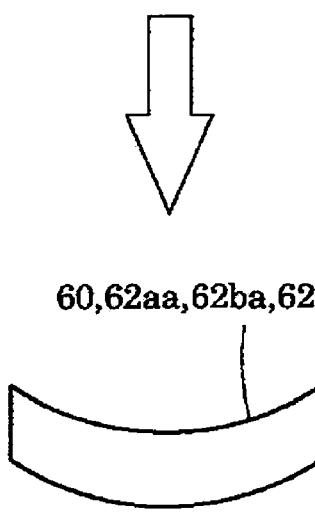

The required level difference to be given to the specific second optical element is determined so that the size of the illumination field formed on the illumination target surface by a beam traveling via the first optical element corresponding to the second optical element, and via the second optical element becomes close to the size of the desired superimposed illumination region. In other words, the level difference between the aforementioned at least one second optical element and other second optical element, or a distance between the at least one first optical element and corresponding second optical element and a distance between the other first optical element and corresponding second optical element are determined so as to make smaller the superposition errors of the illumination regions formed on the illumination target surface by the beams traveling via the first optical elements and the corresponding second optical elements. When the third technique of an embodiment is applied to the simple example shown in FIG. 8, a reflecting surface of the second concave reflector element 81*ba* is arranged on the standard array surface and a reflecting surface of the second concave reflector element 81*aa* and a reflecting surface of the second concave reflector element 81*ca* are arranged with their respective required level differences from the standard array surface, as shown in the upper part of FIG. 10.

When the reflecting surface of the second concave reflector element 81*aa* is arranged with the required level difference from the standard array surface, an optical path length L1*b* between the first concave reflector element 61*ba* and the second concave reflector element 81*aa* and an optical path length L2*b* from the second concave reflector element 81*aa* to the illumination target surface are adjusted. Similarly, when the reflecting surface of the second concave reflector element 81*ca* is arranged with the required level difference from the standard array surface, an optical path length L1*c* between the first concave reflector element 61*ca* and the second concave reflector element 81*ca* and an optical path length L2*c* from the second concave reflector element 81*ca* to the illumination target surface are adjusted.

In contrast to it, the reflecting surface of the second concave reflector element 81*ba* is arranged on the standard array surface without any level difference, and therefore an optical path length L1*a* between the first concave reflector element 61*aa* and the second concave reflector element 81*ba* and an optical path length L2*a* from the second concave reflector element 81*ba* to the illumination target surface are not adjusted. As a result, as seen with reference to the aforementioned Eq (b), the magnification of the arcuate illumination field 62*ba* formed by the beam traveling via the first concave reflector element 61*ba* and the second concave reflector element 81*aa* and the magnification of the arcuate illumination field 62*ca* formed by the beam traveling via the first concave reflector element 61*ca* and the second concave reflector element 81 ca vary according to the level differences thus given.

On the other hand, the magnification of the arcuate illumination field 62*aa* formed by the beam traveling via the first concave reflector element 61*aa* and the second concave reflector element 81*ba* (i.e., the illumination field originally having the small superposition error relative to the desired arcuate superimposed illumination region 60) is invariant because the reflecting surface of the second concave reflector element 81*ba* is given no level difference. In this manner, as schematically shown in the lower part of FIG. 10, the sizes of the other arcuate illumination fields 62*ba* and 62*ca* as well as the arcuate illumination field 62*aa* become close to the size of the desired superimposed illumination region 60 (and the illumination region IR eventually), so as to keep small the superposition errors of the illumination fields due to the magnification differences among the optical elements.

Namely, when the third technique of an embodiment is applied to the optical integrator 18 of the present embodiment, the same effect is also achieved as in the case of application of the first technique and in the case of application of the second technique. Furthermore, by applying one or more techniques selected from the first technique, the second technique, and the third technique of an embodiment to the optical integrator 18 of the present embodiment, it is feasible to keep small the superposition errors of the illumination fields formed on the illumination target surface by the plurality of beams obtained by wavefront division.

Figure 11:
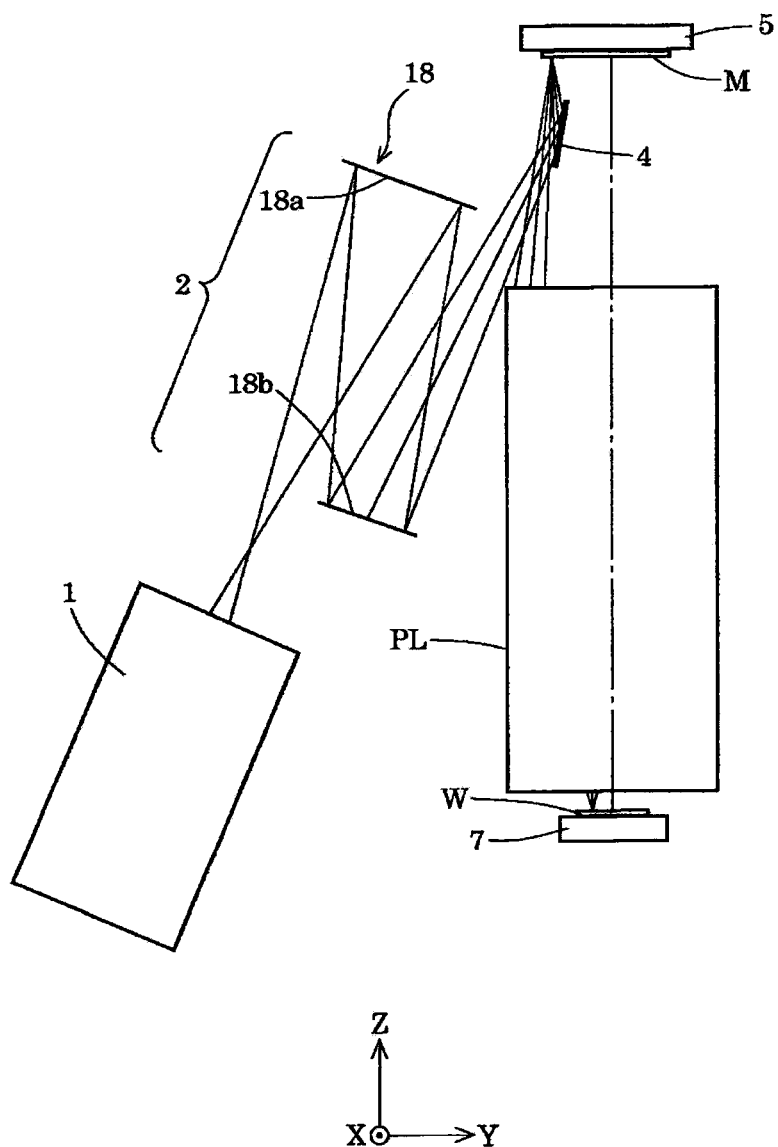
FIG. 11 is a drawing schematically showing a configuration of an exposure apparatus provided with a projection optical system as an inverse pupil optical system.

The fourth technique of an embodiment will be described below on the basis of an exposure apparatus of an inverse pupil type as shown in FIG. 11, i.e., on the basis of the exposure apparatus provided with the projection optical system PL configured as an inverse pupil optical system. The exposure apparatus of the inverse pupil type shown in FIG. 11 has a configuration similar to the exposure apparatus of the normal pupil type shown in FIGS. 1 and 2, but is different from the exposure apparatus of the normal pupil type in that the illumination optical system 2 is composed of only the optical integrator 18. In the exposure apparatus of the normal pupil type the entrance pupil of the projection optical system is located on the projection optical system side with respect to the object plane, whereas in the exposure apparatus of the inverse pupil type the entrance pupil of the projection optical system is located on the opposite side to the projection optical system with respect to the object plane. In FIG. 11, elements with the same functions as the constituent elements shown in FIGS. 1 and 2 are denoted by the same reference symbols as those in FIGS. 1 and 2. The configuration and action of the exposure apparatus of the inverse pupil type shown in FIG. 11 will be described below with focus on differences from the exposure apparatus of the normal pupil type. The teachings of the U.S. Pat. No. 6,781,671 is incorporated by reference.

In the exposure apparatus of the inverse pupil type shown in FIG. 11, the light from the light source 1 is once focused and thereafter incident to the optical integrator 18 in the illumination optical system 2. Namely, the light from the light source 1 is incident to the first fly's eye optical system 18a of the optical integrator 18, without traveling via any optical member having a power (e.g., an optical member like the concave reflecting mirror 17 shown in FIG. 2). The power of the optical member is the inverse of the focal length of the optical member. It is a matter of course that an optical member having a power can be interposed. The beams obtained by wavefront division by the plurality of arcuate first concave reflector elements 18aa (not shown in FIG. 11) in the first fly's eye optical system 18a are reflected by the corresponding rectangular second concave reflector elements 18ba (not shown in FIG. 11) in the second fly's eye optical system 18b and thereafter emitted from the illumination optical system 2.

The light emerging from the illumination optical system 2 travels via an oblique incidence mirror (plane reflecting mirror) 4 to form an arcuate illumination region on the mask M. Namely, the light traveling via the second fly's eye optical system 18b of the optical integrator 18 is guided to the pattern surface of the mask M as an illumination target surface, without traveling via any optical member having a power (e.g., an optical member like the condenser optical system 19 shown in FIG. 2). In the exposure apparatus of the inverse pupil type, a substantial surface illuminant (pupil intensity distribution) having a predetermined shape is also formed at a position (position of the illumination pupil) near the exit surface of the optical integrator 18, i.e., near the reflecting surface of the second fly's eye optical system 18b.

This substantial surface illuminant is formed at the position of the exit pupil of the illumination optical system 2 consisting of the pair of fly's eye optical systems 18a and 18b. The position of the exit pupil of the illumination optical system 2 (i.e., the position near the reflecting surface of the second fly's eye optical system 18b) is coincident with the position of the entrance pupil of the projection optical system PL. As described above, the projection optical system PL is the inverse pupil optical system having the entrance pupil at the position apart by a predetermined distance on the opposite side to the projection optical system PL with respect to the object plane where the mask M is arranged. In the exposure apparatus of the inverse pupil type, the number of reflections of the EUV light in the illumination optical system 2 is smaller than that in the exposure apparatus of the normal pupil type, and therefore the luminous efficiency is improved when compared with the exposure apparatus of the normal pupil type.

Prior to specific description of the fourth technique of an embodiment, consideration will be given to influence of a distance K between a center of the array surface of the plurality of first concave reflector elements (generally, first optical elements) 18aa in the first fly's eye optical system 18a and a center of the standard array surface of the plurality of second concave reflector elements (generally, second optical elements) 18ba in the second fly's eye optical system 18b, with reference to FIG. 12. As described above, the standard array surface of the plurality of second concave reflector elements 18ba is a plane where the plurality of second concave reflector elements 18ba are arrayed according to the technique of the conventional technology.

Figure 12:
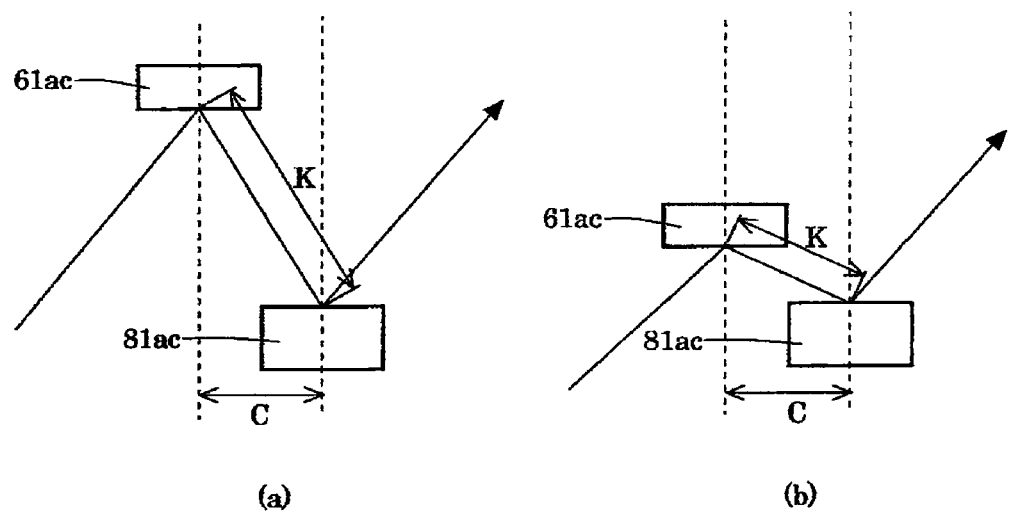
FIG. 12 is a drawing for giving consideration to influence of distance K between a center of an array surface of first concave reflector elements and a center of a standard array surface of second concave reflector elements.

For easier understanding of the description, FIG. 12 shows only the first concave reflector element 61ac arranged in the center of the plurality of first concave reflector elements 18aa and the second concave reflector element 81ac arranged in the center of the plurality of second concave reflector elements 18ba. Furthermore, for easier understanding of the description, it is assumed in FIG. 12 that the second concave reflector element 81 ac is arranged on the standard array surface, the array surface of the plurality of first concave reflector elements 18aa is approximately parallel to the standard array surface of the plurality of second concave reflector elements 18ba, and the light reflected by the first concave reflector element 61ac is incident to the second concave reflector element 81ac. In this case, the center-center distance K between the two array surfaces is nothing but a distance between the center of the reflecting surface of the first concave reflector element 61ac and the center of the reflecting surface of the second concave reflector element 81ac.

When an offset amount along the array surfaces between the first concave reflector element 61ac and the second concave reflector element 81ac (and, therefore, an offset amount between the first fly's eye optical system 18a and the second fly's eye optical system 18b), C, is constant, the angle of incidence of the light to the reflecting surface of the first concave reflector element 61ac and the angle of incidence of the light to the reflecting surface of the second concave reflector element 81ac are smaller in a configuration where the distance K is set to be relatively large as shown in FIG. 12 (a) than in a configuration where the distance K is set to be relatively small as shown in FIG. 12 (b). As also readily seen by analogy from FIG. 12, the angles of incidence of light to the reflecting surfaces of the other first concave reflector elements 18aa and the angles of incidence of light to the reflecting surfaces of the other second concave reflector elements 18ba are also smaller in the configuration where the distance K is set to be large.

When the distance K is set large as described above, the angles of incidence of the light to the reflecting surfaces of the concave reflector elements 18aa, 18ba can be kept small, and it is thus feasible to secure large reflectance of multilayer reflecting films forming the reflecting surfaces of the concave reflector elements 18aa, 18ba. This is because film-forming steps of the multilayer reflecting films are carried out for each predetermined angular range. When the distance K is set large, the angles of incidence of light to the reflecting surfaces of the concave reflector elements 18aa, 18ba are kept small, whereby occurrence of aberration in the optical integrator 18 is kept small, so as to make small the superposition errors of illumination fields due to aberration.

When the distance K is set large as described above, various effects are achieved including improvement in reflectance, reduction in film-forming time, and reduction of superposition errors of illumination fields. However, when only the distance K were simply set large in practical design, various adverse effects could be caused. It is also possible to keep small the angles of incidence of light to the reflecting surfaces of the concave reflector elements 18aa, 18ba by setting the offset amount C small, but there is naturally a limit to setting the offset amount C small, in order to avoid interference between the incident beam to the first fly's eye optical system 18a and the second fly's eye optical system 18b and interference between the emerging beam from the second fly's eye optical system 18b and the first fly's eye optical system 18a.

Figure 13:
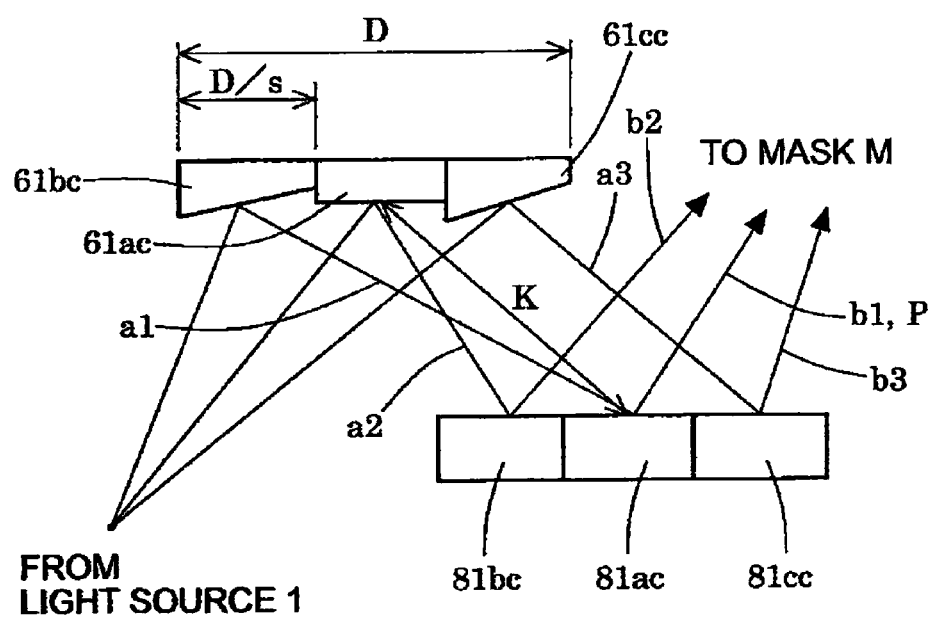
FIG. 13 is a drawing to illustrate a fourth technique of an embodiment, which is a drawing corresponding to FIG. 8.

FIG. 13 is a drawing for explaining the fourth technique of an embodiment, which is a drawing corresponding to FIG. 8. FIG. 13 shows a first concave reflector element 61 ac arranged in the center of the plurality of first concave reflector elements 18aa, a pair of first concave reflector elements 61bc and 61cc arranged on both sides thereof, a second concave reflector element 81ac arranged in the center of the plurality of the second concave reflector elements 18ba, and a pair of second concave reflector elements 81bc and 81cc arranged on both sides thereof. The first concave reflector element 61bc corresponds to the second concave reflector element 81ac, the first concave reflector element 61ac to the second concave reflector element 81bc, and the first concave reflector element 61cc to the second concave reflector element 81cc.

In the case of the exposure apparatus of the inverse pupil type where there is no condenser optical system interposed between the optical integrator 18 and the mask M, as described in association with Eq (b), the magnification of the illumination field formed on the illumination target surface (pattern surface of the mask M) by a beam traveling via one first concave reflector element in the first fly's eye optical system and a corresponding second concave reflector element (length in the predetermined direction of the illumination field/length in the predetermined direction of the reflecting surface of the first concave reflector element), β, is represented by Eq (c) below, using an optical path length L1 between the corresponding pair of optical elements and an optical path length L3 from the second concave reflector element to the illumination target surface.

$$\beta = L3/L1 \quad (c)$$

Specifically, with reference to FIG. 13, an optical path length between the first concave reflector element 61bc and the second concave reflector element 81ac is a1, an optical path length between the first concave reflector element 61 ac and the second concave reflector element 81bc is a2, and an optical path length between the first concave reflector element 61cc and the second concave reflector element 81cc is a3. Furthermore, an optical path length from the second concave reflector element 81ac to the mask M is b1, an optical path length from the second concave reflector element 81bc to the mask M is b2, and an optical path length from the second concave reflector element 81cc to the mask M is b3. The optical path lengths (distances) a1-a3 correspond to the optical path length L1 between the optical elements and the optical path lengths (distances) b1-b3 correspond to the optical path length L3 from the second concave reflector element to the illumination target surface.

Therefore, the magnification β1 of the illumination field (illumination region) formed by the beam traveling via the first concave reflector element 61bc and corresponding second concave reflector element 81ac, the magnification β2 of the illumination field formed by the beam traveling via the first concave reflector element 61ac and corresponding second concave reflector element 81bc, and the magnification β3 of the illumination field formed by the beam traveling via the first concave reflector element 61cc and corresponding second concave reflector element 81cc are represented by Eqs (d1), (d2), and (d3), respectively, below.

$$\beta 1 = b1/a1 \quad (d1)$$

$$\beta 2 = b2/a2 \quad (d2)$$

$$\beta 3 = b3/a3 \quad (d3)$$

It is seen with reference to Eqs (d1) to (d3) that, in order to keep small the so-called superposition errors of the illumination fields due to the magnification differences among the optical elements, it is important to keep small variation in bi/ai (i=1-3 in FIG. 13; i=1–n in general (where n is a total number of first concave reflector elements)). While consideration is given to the fact that the optical path length bi is longer than the optical path length ai and, therefore, that the variation in the optical path length bi is smaller than the variation in the optical path length ai, it is seen that, in order to keep small the variation in bi/ai (dispersion of magnification βi), it is effective to set the center-center distance K between two array surfaces large and thereby to keep small the variation in the optical path length ai. The effectiveness of setting the distance K large is as described with reference to FIG. 12, but only the distance K cannot be simply set large in practical design, as described above. Now, let us consider an appropriate range of the distance K.

As described previously, the entrance surface of the first fly's eye optical system 18a has the contour close to the circular shape in order to enhance the illumination efficiency because the sectional shape of the beam incident to the optical integrator 18 (i.e., the beam incident to the first fly's eye optical system 18a) is approximately circular. Therefore, when the length along the x-direction of the first fly's eye optical system 18a shown in FIG. 4 is designated by D, the length D corresponds to the diameter of a circle inscribed in the entrance surface of the first fly's eye optical system 18a and the length D can be called the size of the first fly's eye optical system 18a. A length along the x-direction of each first concave reflector element 18aa forming the first fly's eye optical system 18a is represented by D/s, using the number s of divisions along the x-direction of the first fly's eye optical system 18a (s=6 in FIG. 4).

In the simplified model shown in FIG. 13, the number s of divisions is 3, the overall size in the horizontal direction in the drawing of the three first concave reflector elements 61bc, 61ac, and 61cc is designated by D, and each element size by D/s. Furthermore, d represents a required length along the X-direction (longitudinal direction) of the arcuate illumination region to be formed on the mask M, and P a distance (optical path length) from the center of the entrance surface of the second fly's eye optical system 18b to the center of the arcuate illumination region. In the simplified model shown in FIG. 13, the distance P is nothing but the optical path length bi from the second concave reflector element 81ac to the mask M.

In this case, a1-a3 in Eqs (d1)-(d3) (ai in general) are approximated by the distance K, b1-b3 (bi in general) by the distance P, and β1-β3 (βi in general) by d/(D/s). As a consequence, an approximate expression represented by Formula (e1) below holds. The approximate expression (e1) can be modified to approximate expression (e2) below.

$$d/(D/s) \approx P/K \quad (e1)$$

$$D/K \approx sd/P \quad (e2)$$

If D/K in approximate expression (e2) is too smaller than sd/P, the actual length along the X-direction of the arcuate illumination region formed on the mask M becomes too smaller than the required length d and, in turn, the actual length along the X-direction of the arcuate static exposure region ER formed on the wafer W becomes too smaller than the required length, which will make implementation of required exposure itself impossible. On the other hand, when D/K is too larger than sd/P, the actual length along the X-direction of the illumination region becomes too larger than the required length d and, in turn, the actual length along the X-direction of the static exposure region ER becomes too larger than the required length, which will cause reduction of throughput due to an excess light quantity loss.

In practical typical design examples, the number s of divisions along the x-direction of the first fly's eye optical system 18a is, for example, approximately 5 to 7. The required length d along the X-direction of the arcuate illumination region is, for example, approximately 104 mm-130 mm in a case where the projection magnification of the projection optical system PL is ¼; it is, for example, approximately 156 mm-182 mm in a case where the projection magnification is ⅙; it is, for example, approximately 208 mm-234 mm in a case where the projection magnification is ⅛. The distance P from the center of the entrance surface of the second fly's eye optical system 18b to the center of the arcuate illumination region is, for example, approximately 1300 mm-3000 mm in the case where the projection magnification is ¼; it is, for example, approximately 1000 mm-3000 mm in the case where the projection magnification is ⅙ or ⅛. In cases where the projection magnification of the projection optical system PL, the number s of divisions, the length d, and the distance P are assumed to vary in these numerical ranges, values of D/K satisfying the relation of D/K=sd/P are given as shown in Table (1) below.

TABLE 1

|  | s = 5 | s = 6 | s = 7 |
|---|---|---|---|
| with the projection magnification of ¼ and d = 104 mm, | | | |
| P = 1300 | 0.40 | 0.48 | 0.56 |
| P = 1700 | 0.31 | 0.37 | 0.43 |
| P = 2200 | 0.24 | 0.28 | 0.33 |
| P = 3000 | 0.17 | 0.21 | 0.24 |
| with the projection magnification of ¼ and d = 130 mm, | | | |
| P = 1300 | 0.50 | 0.60 | 0.70 |
| P = 1700 | 0.38 | 0.46 | 0.54 |
| P = 2200 | 0.30 | 0.35 | 0.41 |
| P = 3000 | 0.22 | 0.26 | 0.30 |
| with the projection magnification of ⅙ and d = 156 mm, | | | |
| P = 1000 | 0.78 | 0.94 | 1.09 |
| P = 1300 | 0.60 | 0.72 | 0.84 |
| P = 1700 | 0.46 | 0.55 | 0.64 |
| P = 2200 | 0.35 | 0.43 | 0.50 |
| P = 3000 | 0.26 | 0.31 | 0.36 |
| with the projection magnification of ⅙ and d = 182 mm, | | | |
| P = 1000 | 0.91 | 1.09 | 1.27 |
| P = 1300 | 0.70 | 0.84 | 0.98 |
| P = 1700 | 0.54 | 0.64 | 0.75 |
| P = 2200 | 0.41 | 0.50 | 0.58 |
| P = 3000 | 0.30 | 0.36 | 0.42 |
| with the projection magnification of ⅛ and d = 208 mm, | | | |
| P = 1000 | 1.04 | 1.25 | 1.46 |
| P = 1300 | 0.80 | 0.96 | 1.12 |
| P = 1700 | 0.61 | 0.73 | 0.86 |
| P = 2200 | 0.47 | 0.57 | 0.66 |
| P = 3000 | 0.35 | 0.42 | 0.49 |
| with the projection magnification of ⅛ and d = 234 mm, | | | |
| P = 1000 | 1.17 | 1.40 | 1.64 |
| P = 1300 | 0.90 | 1.08 | 1.26 |

TABLE 1-continued

|  | s = 5 | s = 6 | s = 7 |
|---|---|---|---|
| P = 1700 | 0.69 | 0.83 | 0.96 |
| P = 2200 | 0.53 | 0.64 | 0.74 |
| P = 3000 | 0.39 | 0.47 | 0.55 |

As shown in Table (1), when the projection magnification of the projection optical system PL, the number s of divisions, the length d, and the distance P in the practical typical design examples are assumed to vary within the aforementioned numerical ranges, it is seen that the values of D/K satisfying the relation of D/K=sd/P fall within the range of 0.17 to 1.64. This means that when the size D of the first fly's eye optical system 18a and the distance K between the center of the array surface of the plurality of first concave reflector elements (first optical elements) 18aa and the center of the standard array surface of the plurality of second concave reflector elements (second optical elements) 18ba satisfy Condition (1) below, the magnification differences among the optical elements can be kept small and, in turn, each illumination region formed by the beam traveling via each first concave reflector element 18aa and corresponding second concave reflector element 18ba can be made close to the desired superimposed illumination region. However, for example, when values of the length d vary over a wider range, the range of values of D/K satisfying the relation of D/K=sd/P will also vary.

$$0.17 < D/K < 1.64 \quad (1)$$

For keeping the magnification differences among the optical elements smaller and, therefore, for making each illumination region closer to the desired superimposed illumination region, Condition (1A) below instead of Condition (1) may be satisfied and Condition (1B) below instead of Condition (1A) may be satisfied. Incidentally, when the projection magnification of the projection optical system PL is ¼, the range of Condition (1A) corresponds to the range of values of D/K satisfying the relation of D/K=sd/P. With the projection magnification of the projection optical system PL being ¼, P being approximately 1700 mm-2200 mm, and s being 5 or 6, the range of Condition (1B) corresponds to the range of values of D/K satisfying the relation of D/K=sd/P.

$$0.17 < D/K < 0.70 \quad (1A)$$

$$0.24 < D/K < 0.46 \quad (1B)$$

The fourth technique of an embodiment is to keep small the superposition errors of illumination fields due to the magnification differences among the optical elements and to make each illumination region close to the desired superimposed illumination region eventually when the size D of the first fly's eye optical system 18a and the center-center distance K between the two array surfaces satisfy Condition (1), (1A), or (1B). In other words, the fourth technique of an embodiment is to determine the size D of the first fly's eye optical system 18a and the center-center distance K between the two array surfaces so that each illumination region becomes close to the desired superimposed illumination region, thereby keeping small the superposition errors of illumination fields due to the magnification differences among the optical elements. When the distance K is set relatively large within the range satisfying Condition (1), (1A), or (1B), the additional effects are achieved including the improvement in reflectance, reduction in film-forming time, and reduction in superposition errors of illumination fields, as described with reference to FIG. 12.

As described above, when the fourth technique of an embodiment is applied to the optical integrator 18 of the present embodiment, the same effect is also achieved as in the case of application of the first technique, in the case of application of the second technique, and in the case of application of the third technique. Furthermore, when one or more techniques selected from the first technique, second technique, third technique, and fourth technique of an embodiment are applied to the optical integrator 18 of the present embodiment, it is feasible to keep small the superposition errors of the illumination fields formed on the illumination target surface by the plurality of beams obtained by wavefront division.

Figure 14:
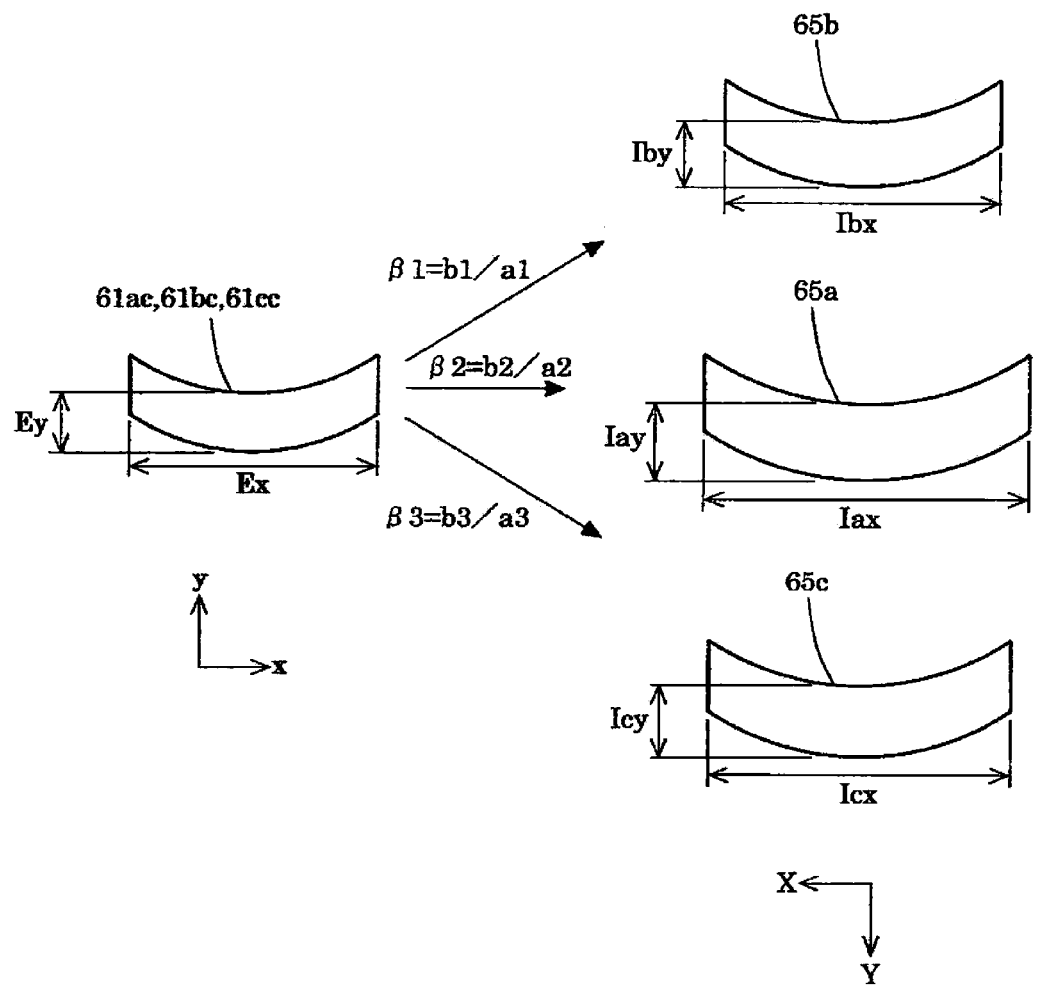
FIG. 14 is a drawing showing a relation between first concave reflector elements in FIG. 13 and respective illumination regions formed corresponding to the respective first concave reflector elements.

Now, based on the exposure apparatus of the inverse pupil type shown in FIG. 11, let us further consider the suppression of the superposition errors of the illumination fields with reference to the simplified model shown in FIG. 13 and others. Let us first assume that the sizes and shapes of the respective first concave reflector elements 61ac, 61bc, 61cc in FIG. 13 are equal to each other as shown in FIG. 14, the length thereof along the x-direction is Ex, and the length thereof along the y-direction is Ey. In this case, the lengths along the X-direction of the respective illumination regions 65a, 65b, and 65c formed corresponding to the respective first concave reflector elements 61ac, 61bc, and 61cc are Iax, Ibx, and Icx and the lengths along the Y-direction thereof are Iay, thy, and Icy.

The lengths of the illumination regions 65a, 65b, and 65c are represented by Eqs (f1) to (f6) below, using the magnifications β1 (=b1/a1), β2 (=b2/a2), and β3 (=b3/a3) between the optical elements, and influence factors A, B such as various aberrations of the illumination optical system and the image rotation due to projection.

$$Iax = Ex \times \beta 2 + A \quad (f1)$$

$$Ibx = Ex \times \beta 1 + A \quad (f2)$$

$$Icx = Ex \times \beta 3 + A \quad (f3)$$

$$Iay = Ey \times \beta 2 + B \quad (f4)$$

$$Iby = Ey \times \beta 1 + B \quad (f5)$$

$$Icy = Ey \times \beta 2 + B \quad (f6)$$

Figure 15:
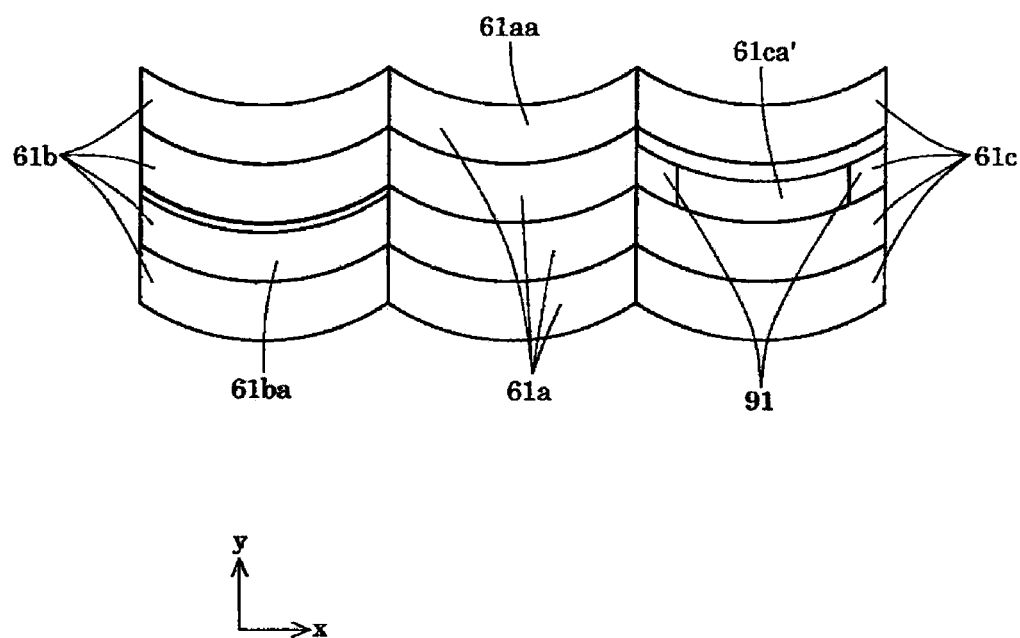
FIG. 15 is a drawing showing an example in which an x-directional length and a y-directional length of a first concave reflector element both are adjusted.

For keeping the superposition errors of illumination fields small, it is important to prevent the lengths of the respective illumination regions from varying among the first concave reflector elements. Then, the second technique of an embodiment proposed the adjustment of the lengths Ex and Ey for each first concave reflector element, in order to prevent the lengths of the respective illumination regions from varying among the first concave reflector elements. In this case, as described with reference to FIG. 9, it is a practical method to adjust the y-directional lengths of the first concave reflector elements. However, as shown in FIG. 15, it is also possible to adjust the x-directional lengths as well as the y-directional lengths for the required number of first concave reflector elements and to locate various sensors 91 or the like by making use of spaces made by the adjustment of the x-directional lengths. FIG. 15 shows adjustment of the y-directional length and the x-directional length of first concave reflector element 61ca' in a configuration corresponding to FIG. 9.

For keeping the superposition errors of illumination fields small, it is important to keep small the variation in magnification βi among the optical elements. Then, the third technique of an embodiment proposed the provision of the required level differences among the second concave reflector elements, in order to prevent the variation in magnification β among the optical elements. The fourth technique of an embodiment proposed Condition (1), (1A), or (1B) to be satisfied, in order to prevent the variation in magnification β among the optical elements. In practice, these techniques may be optionally carried out in combination, in order to suppress the superposition errors of the illumination fields.

Furthermore, with reference to Eqs (f4) to (f6), for keeping small the variation in the Y-directional lengths of the respective illumination regions, it is important to keep small the variation in magnification βi among the optical elements and to keep small the variation in the y-directional lengths of the respective first concave reflector elements. Namely, in the second technique of an embodiment, variance $t^2$ of the y-directional lengths of the plurality of first concave reflector elements 18aa, which is defined by $\Sigma(Ta-Ti)^2/n$, where Ti (i=1-n) is the y-directional length of each element out of the plurality of (n) first concave reflector elements (first optical elements) 18aa, Ta an average of the y-directional lengths of the n first concave reflector elements 18aa, and Σ a summation from i=1 to i=n, may satisfy Condition (2) below.

$$0.05 < t^2 < 0.35 \quad (2)$$

When the variance is larger than the upper limit of Condition (2), the variation of the y-directional lengths of the first concave reflector elements 18aa becomes too large, so as to result in increase in the superposition errors of the illumination fields and increase in the light quantity loss eventually. On the other hand, when the variance is smaller than the lower limit of Condition (2), the variation of the y-directional lengths of the first concave reflector elements 18aa becomes too small, so as to result in decrease in the offset amount between the first fly's eye optical system 18a and the second fly's eye optical system 18b and increase in the possibility of mechanical interference between the first fly's eye optical system 18a and the mask M.

For easier understanding, the description about the fourth technique of an embodiment and the description about Condition (2) were given based on the exposure apparatus of the inverse pupil type. It is, however, noted that the fourth technique of an embodiment and Condition (2) can also be applied similarly to the optical integrator used in the exposure apparatus of the normal pupil type, without having to be limited to the exposure apparatus of the inverse pupil type.

In the above description, the first concave reflector elements 18aa in the first fly's eye optical system 18a have the arcuate contour and the second concave reflector elements 18ba in the second fly's eye optical system 18b have the rectangular contour. However, without having to be limited to this example, various forms can be contemplated as to the contours of the reflectors and the positive and negative arrangement of the powers of the reflectors.

In the above description an embodiment was applied to the reflection type optical integrator, but, without having to be limited to it, an embodiment can also be applied, for example, to refraction type and diffraction type optical integrators. When an embodiment is applied to a refraction type optical integrator, the first fly's eye optical system and the second fly's eye optical system are constructed by arranging optical elements, e.g., microscopic lens elements in parallel. In this case, the first fly's eye optical system and the second fly's eye optical system may be formed in an integral form or in separate forms. The refraction type optical integrator with the first fly's eye optical system and the second fly's eye optical system formed in separate forms is disclosed, for example, in Japanese Patent Application Laid-open No. 08-262367 and U.S. Pat. No. 5,760,963 corresponding thereto or in Japanese Patent Application Laid-open No. 8-31736 and U.S. Pat. No.

5,594,526 corresponding thereto. The teachings of the U.S. Pat. Nos. 5,760,963 and 5,594,526 are incorporated by reference.

In the aforementioned embodiment, the mask can be replaced with a variable pattern forming device for forming a predetermined pattern based on predetermined electronic data. Use of this variable pattern forming device minimizes the effect on synchronization accuracy even if the pattern surface is set vertical. The variable pattern forming device can be, for example, a DMD (Digital Micromirror Device) including a plurality of reflective elements driven based on predetermined electronic data. The exposure apparatus with the DMD is disclosed, for example, in Japanese Patent Application Laid-open No. 2004-304135 or in International Publication WO2006/080285 and U.S Pat. Published Application No. 2007/0296936 corresponding thereto. The teachings of the U.S Pat. Published Application No. 2007/0296936 are incorporated by reference. Besides the non-emission type reflective spatial optical modulators like the DMD, it is also possible to use a transmissive spatial optical modulator or a self-emission type image display device. The variable pattern forming device may be used in the case where the pattern surface is set horizontal.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 16:
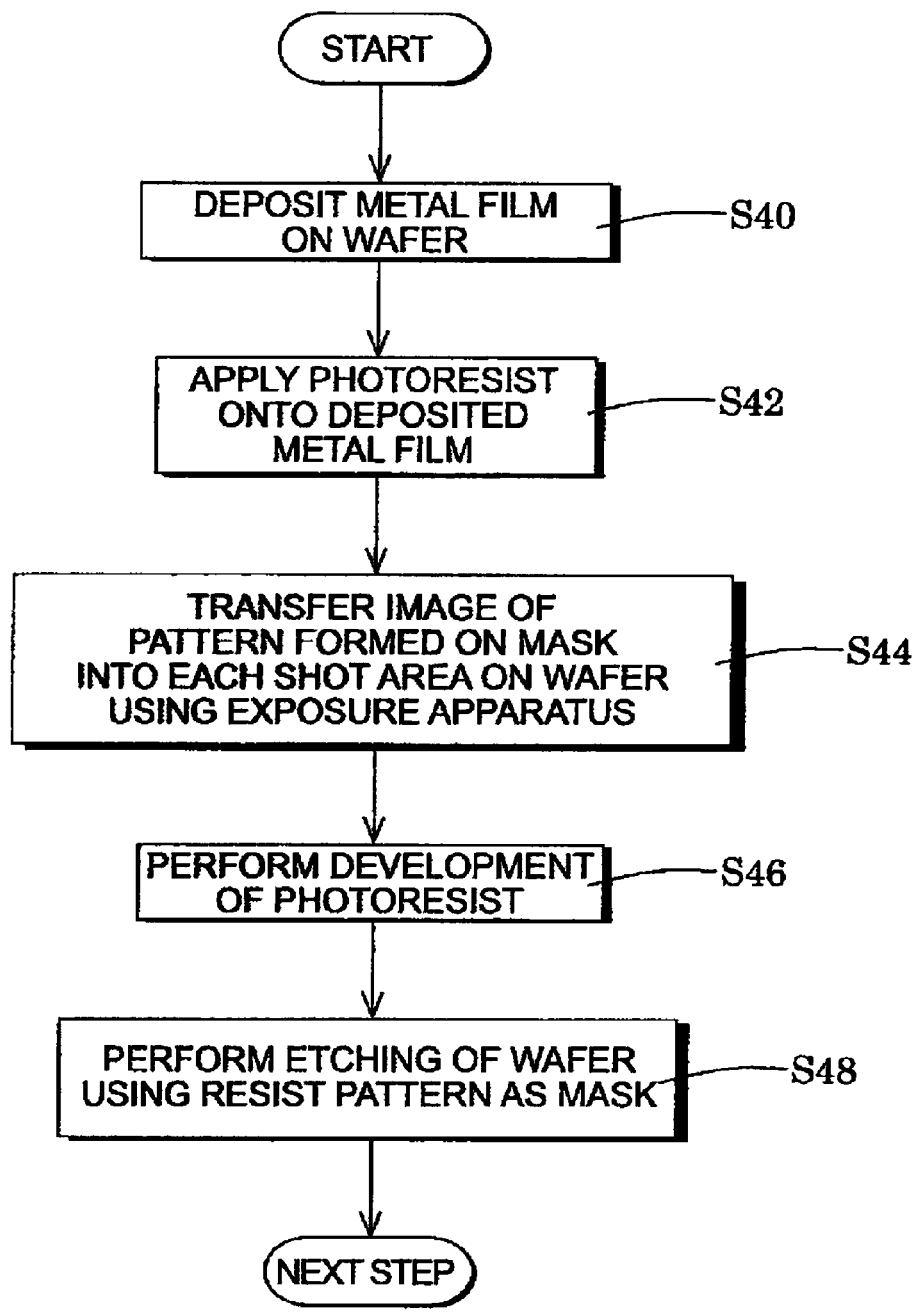
FIG. 16 is a drawing showing a flowchart of an example of a method to manufacture semiconductor devices as micro devices.

The following will describe a device manufacturing method using the exposure apparatus according to the above-described embodiment. FIG. 16 is a flowchart showing manufacturing blocks of semiconductor devices. As shown in FIG. 16, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the exposure apparatus of the above embodiment (block S44: exposure block), and developing the wafer W after completion of the transfer, i.e., developing the photoresist to which the pattern has been transferred (block S46: development block). Thereafter, using the resist pattern made on the surface of the wafer W in block S46, as a mask, processing such as etching is carried out on the surface of the wafer W (block S48: processing block).

The resist pattern herein is a photoresist layer in which depressions and projections are formed in a shape corresponding to the pattern transferred by the exposure apparatus of the above embodiment and which the depressions penetrate throughout. Block S48 is to process the surface of the wafer W through this resist pattern. The processing carried out in block S48 includes, for example, at least either etching of the surface of the wafer W or deposition of a metal film or the like. In block S44, the exposure apparatus of the above embodiment performs the transfer of the pattern onto the wafer W coated with the photoresist, as a photosensitive substrate.

The above embodiment uses the laser plasma X-ray source as a light source for supplying the EUV light. Without having to be limited to this, however, it is also possible, for example, to adopt a synchrotron orbit radiation (SOR) as the EUV light.

The above embodiment is the application of an embodiment to the exposure apparatus having the light source to supply the EUV light. Without having to be limited to this, however, an embodiment is also applicable to exposure apparatus having a light source to supply any wavelength light other than the EUV light.

The aforementioned embodiment is the application of an embodiment to the illumination optical system of the EUVL exposure apparatus using the reflection type mask M, but, without having to be limited to this, an embodiment can also be applied to a generally-used illumination optical system which illuminates an illumination target surface on the basis of light from a light source.

According to one aspect of an embodiment, at least two first optical elements out of the plurality of first optical elements constituting the first fly's eye optical system are set so that the postures thereof about the optical axis of the illumination optical system or about the axis parallel to the optical axis are different from each other. For example, the postures of the at least two first optical elements are determined so that orientations of the illumination regions formed on the illumination target surface by beams traveling via the first optical elements and corresponding second optical elements become close to the orientation of the desired superimposed illumination region. As a result, the optical integrator according to one aspect of an embodiment is able to keep small the superposition errors of the illumination fields formed on the illumination target surface by the plurality of beams obtained by wavefront division by the plurality of first optical elements.

The illumination optical system according to an embodiment is able to illuminate the illumination target surface under the required illumination condition with high luminous efficiency while keeping small the light quantity loss due to the superposition errors of the illumination fields, using the optical integrator which keeps the superposition errors of the illumination fields small. The exposure apparatus according to an embodiment is able to manufacture devices with excellent performance by implementing excellent exposure under a good illumination condition, using the illumination optical system which illuminates a pattern on an illumination target surface under a required illumination condition with high luminous efficiency while suppressing the light quantity loss.

It should be noted that the embodiments given above were described for facilitating the understanding of the present invention but not for limiting the present invention. Therefore, the elements disclosed in the above embodiments are intended to embrace all design changes and equivalents belonging to the technical scope of the present invention.

The invention is not limited to the fore going embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An optical integrator used in an illumination optical system that illuminates an illumination target surface with light from a light source, the optical integrator comprising:
a first fly's eye optical system having a plurality of first optical elements arranged in parallel at a position optically conjugate with the illumination target surface in an optical path between the light source and the illumination target surface; and
a second fly's eye optical system having a plurality of second optical elements arranged in parallel so as to correspond to the plurality of first optical elements in an optical path between the first fly's eye optical system and the illumination target surface,
wherein a size D of the first fly's eye optical system and a distance K between a center of an array surface of the plurality of first optical elements and a center of a standard array surface of the plurality of second optical elements are determined so that each illumination region formed on the illumination target surface by a beam traveling via each first optical element and corresponding second optical element becomes close to a desired superimposed illumination region, and
wherein there is no optical member having a power in an optical path between the second fly's eye optical system and the illumination target surface.

2. The optical integrator according to claim 1, wherein the distance K between the center of the array surface of the plurality of first optical elements and the center of the standard array surface of the plurality of second optical elements and the size D in a direction of the array surface of the first fly's eye optical system satisfy the following condition:

$0.17 < D/K < 1.64.$

3. The optical integrator according to claim 1, wherein the distance K between the center of the array surface of the first optical elements and the center of the standard array surface of the plurality of second optical elements and the size D in a direction of the array surface of the first fly's eye optical system satisfy the following condition:

$0.17 < D/K < 0.70.$

4. The optical integrator according to claim 3, wherein the plurality of first optical elements and the plurality of second optical elements are in one-to-one correspondence.

5. The optical integrator according to claim 4, wherein the plurality of first optical elements and the plurality of second optical elements are in one-to-one correspondence in accordance with such a relation that when a plurality of line segments connecting corresponding paired optical elements are projected onto a certain plane, at least a pair of projected line segments intersect.

6. An illumination optical system for illumination an illumination target surface with light from a light source, said illumination optical system comprising the optical integrator as set forth in claim 3.

7. An exposure apparatus comprising the illumination optical system as set forth in claim 6 for illumination a predetermined pattern, said exposure apparatus implementing exposure of the predetermined pattern on a photosensitive substrate.

8. A device manufacturing method comprising:
implementing the exposure of the predetermined pattern on the photosensitive substrate, using the exposure apparatus as set forth in claim 7;
developing the photosensitive substrate with the predetermined pattern transferred, and forming a mask layer in a shape corresponding to the predetermined pattern, on a surface of the photosensitive substrate; and
processing the surface of the photosensitive substrate through the mask layer.

9. The illumination optical system according to claim 6, further comprising a condenser optical system arranged in an optical path between the optical integrator and the illumination target surface and configured to make a plurality of beams traveling via the plurality of first optical elements, superimposed on the illumination target surface.

10. The illumination optical system according to claim 6, wherein there is no optical member having a power in the optical path between the optical integrator and the illumination target surface.

11. The optical integrator according to claim 1, wherein the distance K between the center of the array surface of the plurality of first optical elements and the center of the standard array surface of the plurality of second optical elements and the size D in a direction of the array surface of the first fly's eye optical system satisfy the following condition:

$0.24 < D/K < 0.46.$

12. The optical integrator according to claim 1, wherein the plurality of first optical elements and the plurality of second optical elements have a concave reflector form.

13. The optical integrator according to claim 1, wherein the first optical elements have an arcuate contour and the second optical elements have a rectangular contour.

14. The optical integrator according to claim 1, wherein the plurality of first optical elements and the plurality of second optical elements are in one-to-one correspondence.

15. The optical integrator according to claim 14, wherein the plurality of first optical elements and the plurality of second optical elements are in one-to-one correspondence in accordance with such a relation that when a plurality of line segments connecting corresponding paired optical elements are projected onto a certain plane, at least a pair of projected line segments intersect.

16. An illumination optical system for illumination an illumination target surface from a light source, said illumination optical system comprising the optical integrator as set forth in claim 1.

17. An exposure apparatus comprising the illumination optical system as set forth in claim 16 for illuminating a predetermined pattern, said exposure apparatus implementing exposure of the predetermined pattern on a photosensitive substrate.

18. The exposure apparatus according to claim 17, comprising a projection optical system which forms an image of the predetermined pattern on the photosensitive substrate, wherein the predetermined pattern and the photosensitive substrate are moved relative to the projection optical system along a scanning direction, thereby implementing projection exposure of the predetermined pattern onto the photosensitive substrate.

19. The exposure apparatus according to claim 18, wherein a direction in which the plurality of first optical elements are arrayed so that their arcuate sides are adjacent to each other in the optical integrator, corresponds to the scanning direction.

20. The exposure apparatus according to claim 18, wherein the predetermined direction in which the length of said at least one first optical element in the optical integrator is adjusted, corresponds to the scanning direction.

21. A device manufacturing method comprising:
implementing the exposure of the predetermined pattern on the photosensitive substrate, using the exposure apparatus as set forth in claim 17;
developing the photosensitive substrate with the predetermined pattern transferred, and forming a mask layer in a shape corresponding to the predetermined pattern, on a surface of the photosensitive substrate; and
processing the surface of the photosensitive substrate through the mask layer.

22. An optical integrator used in an illumination optical system that illuminates an illumination target surface with light from a light source, the optical integrator comprising:
a first fly's eye optical system having a plurality of first optical elements arranged in parallel at a position optically conjugate with the illumination target surface in an optical path between the light source and the illumination target surface; and
a second fly's eye optical system having a plurality of second optical elements arranged in parallel so as to correspond to the plurality of first optical elements in an optical path between the first fly's eye optical system and the illumination target surface,
wherein a distance K between a center of an array surface of the plurality of first optical elements and a center of a standard array surface of the plurality of second optical elements and a size D of the first fly's eye optical system in a direction of the array surface of the first fly's eye optical system satisfy the following condition:

$$0.17<D/K<1.64.$$

23. The optical integrator according to claim 22, wherein there is no optical member having a power in an optical path between the second fly's eye optical system and the illumination target surface.

24. The optical integrator according to claim 22, wherein the plurality of first optical elements and the plurality of second optical elements have a concave reflector form.

25. The optical integrator according to claim 22, wherein the first optical elements have an arcuate contour and the second optical elements have a rectangular contour.

26. An optical integrator used in an illumination optical system that illuminates an illumination target surface with light from a light source, the optical integrator comprising;
a first fly's eye optical system having a plurality of first optical elements arranged in parallel at a position optically conjugate with the illumination target surface in an optical path between the light source and the illumination target surface; and
a second fly's eye optical system having a plurality of second optical elements arranged in parallel so as to correspond to the plurality of first optical elements in an optical path between the first fly's eye optical system and the illumination target surface.
wherein a distance K between a center of an array surface of the plurality of first optical elements and a center of a standard array surface of the plurality of second optical elements and a size D of the first fly's eye optical system in a direction of the array surface of the first fly's eye optical system satisfy the following condition:

$$0.17<D/K<0.70.$$

27. An optical integrator used in an illumination optical system that illuminates an illumination target surface with light from a light, source, the optical integrator comprising:
a first fly's eye optical system having a plurality of first optical elements arranged, in parallel at a position optically conjugate with the illumination target surface in an optical path between the light source and the illumination target surface; and
a second fly's eye optical system having a plurality of second optical elements arranged in parallel so as to correspond to the plurality of first optical elements in an optical path between the first fly's eye optical system and the illumination target surface.
wherein a distance K between a center of an array surface of the plurality of first optical elements and a center of a standard array surface of the plurality of second optical elements and a size D of the first fly's eye optical system in a direction of the array surface of the first fly eye optical system satisfy satisfying the following condition:

$$0.24<D/K<0.46.$$

* * * * *

UNITED STATES PATENT AND TRADEMARK OFFICE
CERTIFICATE OF CORRECTION

PATENT NO. : 8,497,977 B2
APPLICATION NO. : 12/706586
DATED : July 30, 2013
INVENTOR(S) : Yoshio Kawabe Page 1 of 1

It is certified that error appears in the above-identified patent and that said Letters Patent is hereby corrected as shown below:

In the Claims:

Claim 3, col. 27, lines 42-43, "surface of the first optical elements" should read -- surface of the plurality of first optical elements --.

Claim 6, col. 27, lines 59-60, "system for illumination an illumination target" should read -- system for illuminating an illumination target --.

Claim 16, col. 28, lines 47-48, "system for illumination an illumination target" should read -- system for illuminating an illumination target --.

Claim 16, col. 28, line 48, "target surface from a light source" should read -- target surface with light from a light source --.

Claim 27, col. 30, line 24, "light, source," should read -- light source, --.

Claim 27, col. 30, lines 40-41, "optical system satisfy satisfying the following condition:" should read -- optical system satisfy the following condition: --.

Signed and Sealed this
Twenty-second Day of April, 2014

Michelle K. Lee
*Deputy Director of the United States Patent and Trademark Office*